United States Patent
Mano et al.

(10) Patent No.: US 6,759,875 B2
(45) Date of Patent: Jul. 6, 2004

(54) VOLTAGE CONTROLLED OSCILLATION CIRCUIT

(75) Inventors: Ryuji Mano, Hyogo (JP); Hiromi Notani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 109 days.

(21) Appl. No.: 10/120,572

(22) Filed: Apr. 12, 2002

(65) Prior Publication Data

US 2002/0186072 A1 Dec. 12, 2002

(30) Foreign Application Priority Data

May 24, 2001 (JP) ........................................ 2001-155024

(51) Int. Cl.[7] .............................. H03K 3/01; H03L 7/06
(52) U.S. Cl. ......................... 326/95; 327/158; 327/534; 331/57
(58) Field of Search .............................. 326/93, 95, 98; 331/57, 185; 327/158, 281, 534

(56) References Cited

U.S. PATENT DOCUMENTS 5,180,995 A * 1/1993 Hayashi et al. ................ 331/57
6,496,056 B1 * 12/2002 Shoji ........................... 327/543

FOREIGN PATENT DOCUMENTS

JP 7-176622 7/1995

* cited by examiner

Primary Examiner—Daniel D. Chang
(74) Attorney, Agent, or Firm—McDermott, Will & Emery

(57) ABSTRACT

Backgate biases of MOS transistors for generating a bias voltage in a bias voltage generation circuit generating the bias voltages are set shallow and backgate biases of MOS transistors of delay circuits of a ring oscillator constituting a clock generation circuit are set shallow. Thereby, a voltage range and a frequency range of a voltage controlled generation circuit to implement a phase synchronizing loop are both extended.

25 Claims, 14 Drawing Sheets

VOLTAGE CONTROLLED OSCILLATION CIRCUIT

BACKGROUND OF THE INVENTION

1. Field of the Invention

The present invention relates to an internal clock generation circuit, and particularly, to a voltage controlled oscillation circuit, used in a phase locked (synchronization) circuit, and having an oscillation frequency adjusted by a bias voltage.

2. Description of the Background Art

In data communication or the like, in order to reproduce transferred data correctly, a necessity arises for recovery of a clock signal in synchronization with a clock signal used in data transmission (a reference clock signal) and then, restoration of the data according to the recovered clock signal. In order to recover a clock signal that exactly tracks in frequency such a reference clock signal, there is generally used a phase locked circuit such as a PLL (a phase locked loop) or DLL (a delayed locked loop).

FIG. 31 is a diagram schematically showing a configuration of a conventional PLL circuit. In FIG. 31, the conventional phase locked circuit (PLL circuit) includes: a voltage controlled oscillation circuit (VCO) 900 having an oscillation frequency controlled by a control voltage VC to generate a recovered dock signal RCLK; a phase comparison circuit 904 comparing in phase recovered clock signal RCLK outputted by voltage controlled oscillation circuit 900 and a reference clock signal CLK with each other to generate a signal corresponding to a phase difference; and a charge pump 906 performing a charge/discharge operation according to a phase difference indicating signal from phase comparison circuit 904 to generate control voltage VC and apply control voltage VC to voltage controlled oscillation circuit 900. Charge pump 906 includes a loop filter to remove a high frequency component of an output thereof and generate control voltage VC.

In the PLL circuit shown in FIG. 31, a negative feedback closed loop is constituted of voltage controlled oscillation circuit 900, phase comparison circuit 904 and charge pump 906, and control voltage VC is adjusted by phase comparison circuit 904 such that a phase difference becomes 0 (zero) between recovered clock signal RCLK and reference clock signal CLK and accordingly the oscillation frequency of voltage controlled oscillation circuit 900 is adjusted. By utilization of a negative feedback of the closed loop, correct frequency tracking can be performed on reference clock signal CLK to generate recovered clock signal RCLK.

FIG. 32 is a diagram showing an example of a configuration of voltage controlled oscillation circuit 900 shown in FIG. 31. Voltage controlled oscillation circuit 900 shown in FIG. 32 is a ring oscillator type voltage controlled oscillation circuit.

In FIG. 32, voltage controlled oscillation circuit 900 includes: a bias voltage generation circuit 900a for generating bias voltages VC1 and VC2 according to control voltage VC; and an oscillation circuit 900b having an oscillation frequency controlled by bias voltages VC1 and VC2. Oscillation circuit 900b includes delay circuits D1 to Dn cascaded in plural stages. An output signal OUT (recovered clock signal RCLK) is generated from delay circuit Dn at the final stage. The output signal of delay circuit Dn at the final stage is fed back to delay circuit D1 at the first stage. Delay circuits D1 to Dn are connected in a ring shape to constitute a ring oscillator.

Bias voltage generation circuit 900a includes: a P channel MOS transistor M2 connected between a power supply node and an internal node AN, and having a gate connected to internal node AN; an N channel MOS transistor (insulated gate field effect transistor) M1 connected between node AN and a ground node, and receiving control voltage VC at the gate thereof, a P channel MOS transistor M3 connected between the power supply node and an internal node BN, and having a gate connected to internal node AN; and an N channel MOS transistor M4 connected between internal node BN and the ground node, and having a gate connected to internal node BN. MOS transistors M2 and M3 constitutes a current mirror circuit, wherein MOS transistor M2 serves as a master transistor, while MOS transistor M3 serves as a slave transistor. Bias voltage VC1 is generated at the gates of MOS transistors M2 and M3. MOS transistor M4 has the gate and drain connected to each other and has the gate voltage set according to the drain current thereof. That is, the gate and drain voltages of MOS transistor M4 are determined such that a discharge current of MOS transistor M4 and a supply current of MOS transistor M3 are in balance with each other. Bias voltage VC2 is generated at the gate and drain of MOS transistor M4.

In oscillation circuit 900b, each of delay circuits D1 to Dn is of the same configuration as is the others and therefore, reference numerals are attached to components of delay circuit Dn at the final stage as a representative. Delay circuit Dn includes: P channel MOS transistors MC1 and MC5 connected in series between a power supply node and an internal output node; and N channel MOS transistors M6 and MC2 connected in series between the internal output node and a ground node. Bias voltages VC1 and VC2 are applied to the gates of respective MOS transistors MC1 and MC2. An output signal of delay circuit (D(n-1)) at the stage previous to the final stage is applied to the gates of MOS transistors M5 and M6 at the final stage.

By applying bias voltages VC1 and VC2 to MOS transistors MC1 and MC2, drive current amounts of MOS transistors MC1 and MC2 are set. MOS transistors MC1 and M2 constitute a current mirror circuit and MOS transistors MC2 and M4 constitute another current mirror circuit. In a case where each of the MOS transistors M3, M4, MC1 and MC2 has the same transistor size as others, currents of the same magnitude flow through the respective MOS transistors M3, M4, MC1 and MC2.

When a voltage level of control voltage VC rises, a conductance of MOS transistor M1 increases to increase a current amount flowing to the ground from MOS transistor M2 through MOS transistor M1. A mirror current of a current supplied by MOS transistor M2 is generated by MOS transistor M3 and supplied to MOS transistor M4. A voltage level of internal node AN is the level at which a current amount that MOS transistor M2 supplies and a current amount that MOS transistor M1 discharges are in balance with each other. Likewise, a voltage of internal node BN is the level at which a current amount that MOS transistor M3 supplies and a current amount that MOS transistor M4 discharges are in balance with each other.

Therefore, when control voltage VC rises, a voltage level of node AN lowers and a voltage level of bias voltage VC1 drops, while a voltage level of node BN rises and bias voltage VC2 rises. With such bias voltage levels, in each of delay circuits D1 to Dn of oscillation circuit 900b, a drive current amount of MOS transistor MC1 increases and a drive current of MOS transistor MC2 increases. Therefore, operating currents of delay circuits D1 to Dn increases to cause operating speeds of delay circuits D1 to Dn to be faster and increase an oscillation frequency of oscillation circuit 900b.

On the other hand, when control voltage VC lowers, a conductance of MOS transistor M1 decreases to decrease a drive current amount thereof. In response, a supply current of MOS transistor M2 decreases to raise a voltage level of internal node AN. With increase of the voltage level at internal node AN, a voltage level of bias voltage VC1 rises and drive current amounts of MOS transistors MC2 and MC4 is reduced and therefore, a voltage level of bias voltage VC2 lowers.

Accordingly, operating current amounts of delay circuits D1 to Dn of oscillation circuit 900b decrease, a delay time is longer; therefore, oscillation frequency of oscillation circuit 900b decreases.

Control voltage VC is at a voltage level corresponding to a phase difference between recovered clock signal RCLK and reference clock signal CLK, and by adjusting the operating current amount of oscillation circuit 900b so as to cause the phase difference to be 0 (zero), an oscillation frequency of oscillation circuit 900b is adjusted to cause a frequency of recovered clock signal RCLK to track that of reference dock signal CLK and thus, a phase of recovered clock signal RCLK is locked at that of reference clock signal CLK.

Currents of the same magnitude flow in MOS transistors M3 and M4 of bias voltage generation circuit 900a (in equilibrium). In oscillation circuit 900b, current source transistors MC1 and MC2 constitute current mirror circuits with respective MOS transistors M2 and M4, and therefore, drive current amounts of current source transistors MC1 and MC2 are equal to each other at all times and thereby, in each of delay circuit D1 to Dn, a rise time and fall time of an output signal are both controlled according to control voltage VC.

FIG. 33 is a graph showing a relationship between control voltage VC and oscillation signal FB of voltage controlled oscillation circuit 900. As shown in FIG. 33, when a voltage level of control voltage VC rises, oscillation frequency FB increases. Herein, a frequency range in which a phase locked loop (a negative feedback closed loop) operates is simply referred to as "a frequency range", and a voltage range in which a phase locked loop operates stably is simply referred to as "a voltage range". In order to stably operate a phase locked loop at all times, it is preferable to set the frequency range and the voltage range as wide as possible. With extension of frequency range and voltage range, a recovered dock signal correctly tracking a reference clock signal in frequency can be stably generated over a wider operating frequency range.

As shown in the graph of FIG. 33, in order to extend a frequency range, a necessity arises for extension in voltage range of control voltage VC. The lower limit of control voltage VC, however, is determined by a threshold voltage Vth of MOS transistor M1 of bias voltage generation circuit 900a. When control voltage VC becomes lower than the threshold voltage of MOS transistor M1, MOS transistor M1 enters a nonconductive state to disable bias voltage generation circuit 900a to generate a bias voltage. On the other hand, a power supply voltage of a reduced voltage level is employed for low power consumption and high speed operation, and therefore, a voltage range of control voltage VC is limited in range from the threshold voltage of MOS transistor M1 to a power supply voltage level, thereby, disabling a sufficiently wide voltage range to be ensured under the condition of a low power supply voltage.

In the above configuration of an internal clock generation circuit, current source transistors MC1 and MC2 are provided in the high level power supply side and the low level power supply side, respectively, in each of delay stages D1 to Dn and drive currents of current source transistors MC1 and MC2 are controlled according to bias voltages VC1 and VC2. In each of the delay stages, however, a current source transistor may be provided only in one of the high level power supply side and low level power supply side.

In such a configuration of the delay stages, no current mirror circuit is necessary in a bias voltage generation circuit and a bias voltage is generated merely by a current/voltage conversion element corresponding to a master transistor M2 according to a drive current of an input transistor. In such an internal clock generation circuit as well, since an operating current in each delay stage is controlled by control voltage VC, there arises a problem similar to that of the internal dock generation circuit shown in FIG. 32.

SUMMARY OF THE INVENTION

It is an object of the present invention to provide an internal clock generation circuit capable of ensuring a sufficiently wide operating range (voltage range) under the condition of a low power supply voltage.

It is another object of the present invention to provide a voltage controlled oscillation circuit capable of stably operating a phase locked loop even under the condition of a low power supply voltage.

An internal dock generation circuit according to a first aspect of the present invention includes: a bias voltage generation circuit including an insulated gate field effect input transistor receiving a control voltage at a gate thereof, and generating a bias voltage according to the control voltage. The insulated gate field effect input transistor receives a voltage having a voltage level different from a voltage of a power supply node at a back gate thereof.

The internal clock generation circuit according to the first aspect of the present invention further includes: a clock generation circuit including a plurality of cascaded delay circuits having respective operating currents determined according to the bias voltage.

An internal clock generation circuit according to a second aspect of the present invention includes: an bias voltage generation circuit generating a bias voltage according to a control voltage; and a clock generation circuit including a plurality of cascaded delay circuits having respective operating currents determined by the bias voltage. Each of the delay circuits includes: a current source insulated gate field effect transistor, coupled to a power supply node, receiving a voltage at a voltage level different from a voltage of the power supply node at a back gate thereof and receiving the bias voltage at a gate thereof.

An internal clock generation circuit according to a third aspect of the present invention includes: a bias voltage generation circuit generating a bias voltage according to a control voltage. The bias voltage generation circuit includes: an input transistor receiving the control voltage at a gate thereof; and a current source circuit coupled between the input transistor and a power supply node, and having a drive current determined according to a conductance of the input transistor. The current source circuit includes: a current/voltage conversion element converting the drive current to a voltage to generate the bias voltage. The current/voltage conversion element includes: an insulated gate field effect transistor receiving a base voltage at a voltage level different from a voltage of the power supply node at a back gate thereof.

The internal clock generation circuit according to the third aspect of the present invention further includes: a clock generation circuit including a plurality of cascaded delay circuits having respective operating currents determined by the bias voltage. Each of the delay circuits includes a current source transistor having a drive current determined by the bias voltage from the bias voltage generation circuit. The current source transistor includes an insulated gate field effect transistor having a backgate connected to a backgate of an insulated gate field effect transistor of the current/voltage conversion element.

An internal clock generation circuit according to a fourth aspect of the present invention includes: a bias voltage generation circuit generating a bias voltage according to a control voltage. The bias voltage generation circuit includes: an input element having a conductance changing according to the control voltage; a current mirror current source circuit having a drive current determined according to the conductance of the input element; and an output transistor having a drive current determined by the drive current of the current source circuit. The current source circuit includes: an insulated gate field effect master transistor coupled between the input element and a first power supply node, and having a drive current determined by a conductance of the input transistor and generating a first bias voltage; and an insulated gate field effect slave transistor having a drive current determined by the drive current of the master transistor. The master and slave transistors receive a voltage at a voltage level different from a voltage of the first power supply node at their respective backgates, and the output transistor is coupled between the slave transistor and a second power supply node and receives a voltage at a voltage level different from a voltage of the second power supply node and generates a second bias voltage according to the drive current of the slave transistor.

The internal clock generation circuit according to the fourth aspect of the present invention further includes: a clock generation circuit including a plurality of cascaded delay circuits having respective operating currents determined according to the first and second bias voltage. Each of the delay circuits includes: a first current source transistor constituted of an insulated gate field effect transistor of a first conductivity type receiving the first bias voltage at a gate thereof, and having a backgate connected to backgates of the master and slave transistors; and a second current source transistor constituted of an insulated gate field effect transistor of a second conductivity type receiving the second bias voltage at a gate thereof, and having a backgate connected to the backgate of the output transistor.

By controlling a backgate voltage of an insulated gate field effect transistor, a backgate bias effect (a substrate effect) is caused to serve and thereby, the absolute value of a threshold voltage of the insulated gate field effect transistor can be decreased to extend a voltage range of the control voltage. Furthermore, with extension in voltage range of the control voltage, a voltage range of the clock generation circuit can be extended, thereby, enabling a wide voltage range to be ensured even under the condition of a low power supply voltage.

Furthermore, by changing a backgate voltage of an insulated gate field effect transistor according to the control voltage, a threshold voltage thereof can be changed according to a value of the control voltage, thereby enabling a linearity in response of a bias voltage to the control voltage to be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
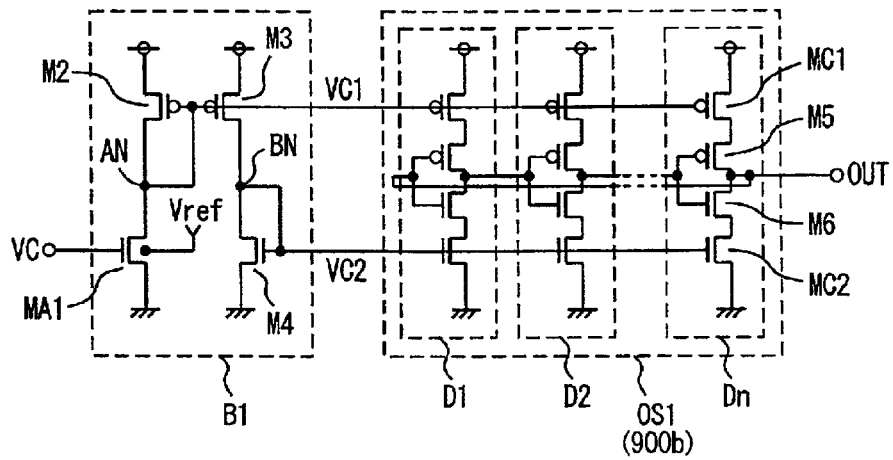
FIG. 1 is a diagram showing a configuration of a voltage controlled oscillation circuit according to a first embodiment of the present invention.
Figure 32:
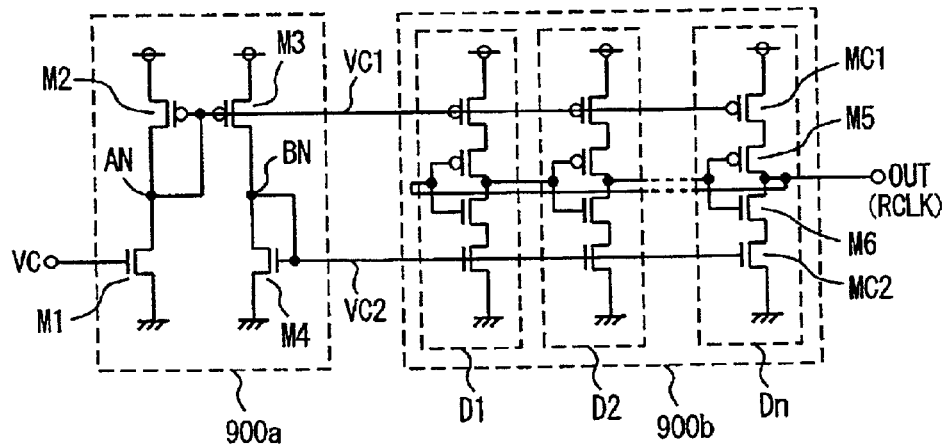
FIG. 32 is a diagram showing an example of a configuration of a conventional voltage controlled oscillation circuit.
Figure 33:
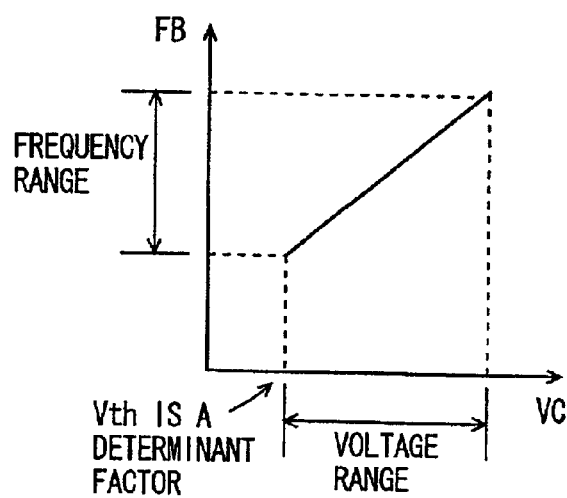
FIG. 33 is a graph illustratively showing a relationship between a frequency and a control voltage of a voltage controlled oscillation circuit.

FIG. 1 is a diagram showing a configuration of an internal clock generation circuit according to a first embodiment of the present invention. The internal clock generation circuit shown in FIG. 1 is of a ring oscillator type voltage controlled oscillation circuit, similar to the configuration shown in FIG. 32.

In FIG. 1, the voltage controlled oscillation circuit includes: a bias voltage generation circuit B1 generating bias voltages VC1 and VC2 according to a control voltage VC; and a ring oscillator OS1 having an oscillation frequency controlled according to bias voltages VC1 and VC2. Ring oscillator OS1 has a configuration similar to a configuration of the oscillation circuit 900b shown in FIG. 26 and includes delay circuits D1 to Dn of an odd number of stages, connected in a ring. An output signal of delay circuit Dn at the final stage is fed back to the input of delay circuit D1 at the first stage.

Each of delay circuits D1 to Dn has the same configuration and includes: current source MOS transistors MC1 and MC2 receiving bias voltages VC1 and VC2 at the respective gates thereof; and MOS transistors M5 and M6 connected in series between current source transistors MC1 and MC2, and receiving an output signal of a delay circuit at the previous stage at gates thereof MOS transistors M5 and M6 constitute a CMOS (complementary MOS) inverter.

Bias voltage generation circuit B1, similar to the conventional circuit, includes: P channel MOS transistors M2 and M3 constituting a current mirror circuit coupled to a high level power supply node (hereinafter simply referred to as power supply nodes); an N channel MOS transistor MA1 connected between an internal node AN and a low level power supply node (hereinafter simply referred to as a ground node), and receiving control voltage VC at a gate thereof; and an N channel MOS transistor M4 connected between a node BN and a ground node, and having a gate connected to node BN. Bias voltage VC1 is generated at the gates of MOS transistors M2 and M3 and bias voltage VC2 is generated at the gate of MOS transistor M4.

MOS transistor MA1 receiving control voltage VC at the gate thereof further receives a reference voltage Vref at the backgate (substrate region) thereof, dissimilar to the conventional circuit. Reference voltage Vref is a positive voltage lower than a voltage of the power supply node to which a current-mirror current source is connected. Accordingly, by a backgate bias effect (a substrate effect) of MOS transistor MA1, a threshold voltage of MOS transistor MA1 decreases with the backgate positively biased relative to the source thereof. Usually, in an N channel MOS transistor, the backgate is at the same voltage level as the source or negatively biased relative to the source, in order to prevent the PN junction in the substrate from being reverse-biased. Therefore, a threshold voltage of N channel MOS transistor MA1 can be decreased compared with the state in a conventional configuration.

MOS transistor MA1 has a conductance changed according to control voltage VC to change a current flowing therethrough. The current flowing through MOS transistor MA1 is supplied from MOS transistor M2. A mirror current of a current flowing through MOS transistors M2 and MA1 is generated by MOS transistor M3 and supplied to MOS transistor M4. Therefore, bias voltage VC1 and VC2 change according to control voltage VC.

Specifically, bias voltage VC1 is equal to a voltage level of node AN when a current supplied by MOS transistor M2 and a current discharged by MOS transistor MA1 are equal to each other. Bias voltage VC2 is equal to a voltage level of node BN when a current supplied by MOS transistor M3 and a current discharged by MOS transistor M4 are equal to each other.

Figure 2:
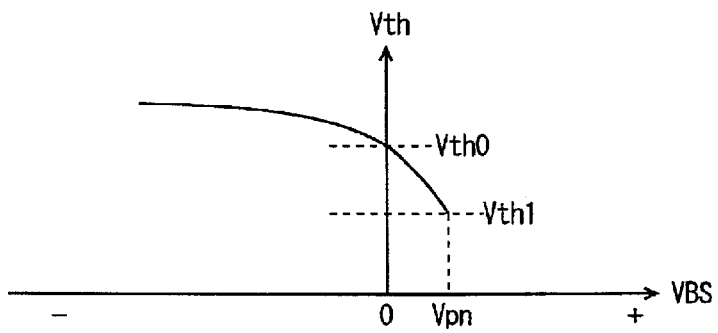
FIG. 2 is a graph showing a relationship between a threshold voltage and a backgate bias of a MOS transistor.

FIG. 2 is a graph illustratively showing a relationship between a threshold voltage and a backgate bias of an N channel MOS transistor. In FIG. 2, a backgate voltage VBS is measured relative to a source voltage. When backgate voltage VBS is set to a negative voltage level, threshold voltage Vth increases. N type source/drain regions of an N channel MOS transistor are generally formed on a P type substrate region. Therefore, reference voltage Vref is required to be set to a voltage level equal to or lower than a so-called "built-in voltage" of the PN junction of the source/drain, in order to prevent the PN junction of the source/drain from entering a forward-biased state to become conductive. Here, the term "a built-in voltage" indicates a voltage at which the PN junction starts to be conducting. By setting reference voltage Vref at a positive voltage level, the threshold voltage is decreased, to lower a voltage level of control voltage VC at which MOS transistor MA1 starts to be conducting.

For example, in FIG. 2, if the threshold voltage is Vth1 when the backgate voltage is a voltage Vpn, threshold voltage Vth1 becomes lower than a threshold voltage Vth0 when the backgate of MOS transistor MA1 is connected to a ground node (a source node). Therefore, since threshold voltage Vth1 defines the lower limit of control voltage VC, a voltage range of control voltage VC can be extended.

It is similar to a conventional configuration that an oscillation frequency of ring oscillator OS1 changes according to bias voltages VC1 and VC2. In each of delay circuits D1 to Dn, current source transistors MC1 and MC2 constitute current mirror circuits with respective MOS transistors M2 and M4. Therefore, a current of the same magnitude as that of a current flowing in MOS transistors M3 and M4 flows in current source transistors MC1 and MC2 (in a case of a mirror ratio of 1). Hence, a wider voltage range can be provided in which an oscillation frequency of ring oscillator OS1 can change according to control voltage VC, thereby enabling the voltage range of a phase locked loop to be extended.

Note that, in ring oscillator OS1 of the configuration shown in FIG. 1, a current source transistor may be provided only in one of the power supply node side and the ground node side in each of delay circuits D1 to Dn.

As described above, according to the first embodiment of the present invention, a reference voltage at a prescribed voltage level is applied to the backgate of an input MOS transistor receiving a control voltage at the gate thereof and thereby the threshold voltage of the input transistor can be decreased. With reduction in the threshold voltage of the input transistor, the lower limit of the control voltage can be lowered, thereby enabling the voltage range in voltage oscillation to be extended.

Second Embodiment

Figure 3:
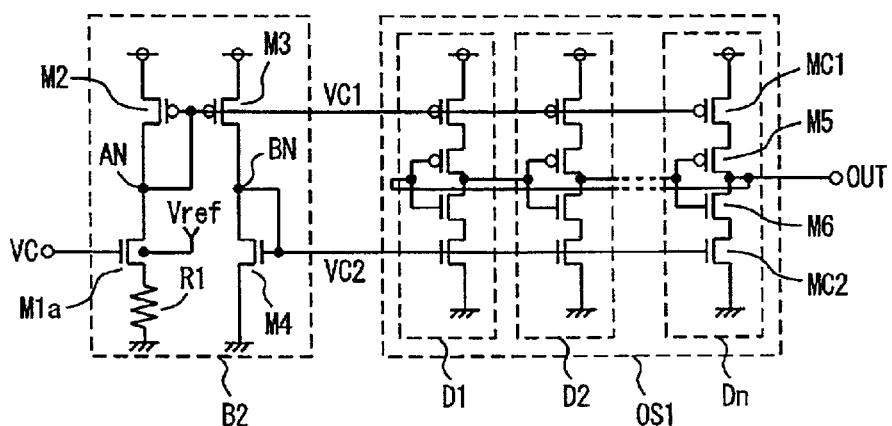
FIG. 3 is a diagram showing a configuration of a voltage controlled oscillation circuit according to a second embodiment of the present invention.

FIG. 3 is a diagram showing a configuration of a voltage controlled oscillation circuit according to a second embodiment of the present invention. In the voltage controlled oscillation circuit shown in FIG. 3, a resistance element R1 is connected between an input MOS transistor M1a receiving control voltage VC at the gate thereof and a ground node in a bias voltage generation circuit B2. The other part of the configuration is the same as that of the configuration shown in FIG. 1, the same reference numerals are attached to corresponding elements and detailed description thereof is omitted.

In the configuration shown in FIG. 3, when a voltage level of control voltage VC rises and a large current flows through MOS transistor M1a, a source voltage of MOS transistor M1a rises because of the presence of resistance element R1. Therefore, even if the backgate receives reference voltage Vref, backgate bias voltage VBS of MOS transistor M1a decreases to increase a threshold voltage of MOS transistor M1a and reduce a conductance thereof. Thereby, it can be suppressed that a large current rapidly flows through MOS transistor M1a when control voltage VC rises.

On the other hand, when control voltage VC lowers and a conductance of MOS transistor M1a decreases, a current flowing through resistance element R1 decreases. Thereby, a source voltage of MOS transistor M1a decreases, the backgate effect thereof increases, and a threshold voltage thereof decreases, which suppresses a rapid decrease in current.

Figure 4:
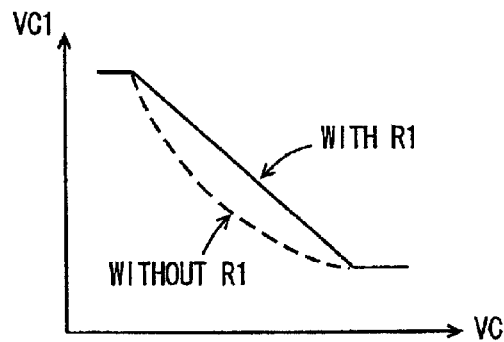
FIG. 4 is a graph illustratively showing a relationship between a control voltage and a bias voltage of the configuration shown in FIG. 3.

Therefore, as shown in FIG. 4, in a case where resistance element R1 is provided, it is suppressed that bias voltage VC1 changes according to a parabolic curve as shown in a broken line and thereby, bias voltage VC1 can change almost linearly with control voltage VC, to improve a linear responsibility of bias voltage VC1 to control voltage VC.

A resistance value of resistance element R1 has only to be a value to suppress a change according to a square characteristic of a drain current of MOS transistor M1a and may be appropriately determined according to an operating current in bias voltage generation circuit B2.

Furthermore, when control voltage VC lowers and a conductance of MOS transistor M1a decreases, a current flowing through resistance element R1 is suppressed to reduce a voltage drop across resistance element R1. Even with resistance element R1 provided, therefore, an effect of decrease in threshold voltage caused by the backgate effect of MOS transistor M1a is large, thereby enabling the lower limit of control voltage VC to be lowered sufficiently.

Note that in the configuration shown in FIG. 3, reference voltage Vref applied can be higher than the reference voltage of the first embodiment by an increase in the source voltage of input transistor M1a due to resistance element R1.

Furthermore, note that in the configuration shown in FIG. 3 as well, a similar effect can be attained even if a current source transistor is provided only in one of the power supply node side and the ground node side in each of delay circuits D1 to Dn of ring oscillator OS1.

Note that in the configuration of the circuit B2 shown in FIG. 3, reference voltage Vref is applied to the backgate of N channel MOS transistor M1a and a backgate bias is different from that of N channel MOS transistor M4. In this case, MOS transistors M4 and M1a are fabricated in individual, separate P type well regions in order to isolate the backgate of MOS transistor M1a from the backgate of MOS transistor M4. Furthermore, since a backgate voltage of N channel MOS transistor M1a is different from a bias voltage of P type substrate region, an N well is formed between a P type well in which MOS transistor M1a is fabricated and the P type substrate region, to isolate the well region in which MOS transistor M1a is fabricated, from the P type substrate region. By use of such a triple well structure, it becomes possible to form the transistors of the circuit B2 in the P type substrate region and a reference voltage can be applied to the backgate of MOS transistor M1a.

As described above, according to the second embodiment of the present invention, a resistance element is connected between an input MOS transistor receiving a control voltage at a gate thereof and a reference voltage at a backgate thereof, and a ground node, and thus, linearity of response of bias voltages to the control voltage can be improved, and correct frequency control can be achieved.

Third Embodiment

Figure 5:
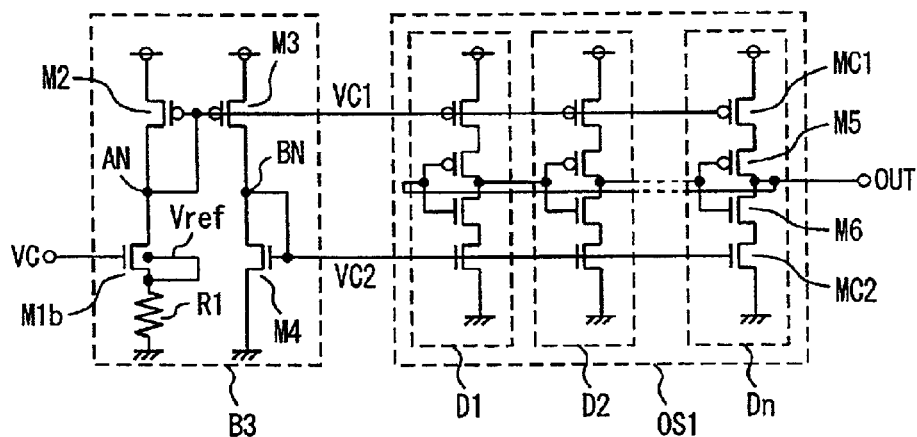
FIG. 5 is a diagram showing a configuration of a voltage controlled oscillation circuit according to a third embodiment of the present invention.

FIG. 5 is a diagram showing a configuration of a voltage controlled oscillation circuit according to a third embodiment of the present invention. In the voltage controlled oscillation circuit shown in FIG. 5, there is formed interconnection between the backgate and source of a MOS transistor M1b receiving control voltage VC at a gate thereof in a bias voltage generation circuit B3. The other part of the configuration is the same as that of the configuration shown in FIG. 3, the same reference numerals are attached to corresponding elements, and detailed description thereof is omitted.

Backgate voltage Vref of MOS transistor M1b is provided by voltage drop across resistance element R1, and therefore, reference voltage Vref changes according to control voltage VC. The backgate and source of MOS transistor M1b are connected to each other to suppress the backgate bias effect, thereby achieving a constant threshold voltage.

When control voltage VC rises, a current flowing through MOS transistor M1b increases. With increase in the drain current, a voltage drop across resistance element R1 increases, a source voltage of MOS transistor M1b rises, and a gate-to-source voltage of MOS transistor M1b decreases. Accordingly, when control voltage VC rises and a large current flows through MOS transistor M1b, it is suppressed that the current amount flowing largely changes according to a parabolic curve.

On the other hand, when control voltage VC lowers, a current flowing through MOS transistor M1b is decreased. With decrease in the drain current of MOS transistor M1b, a voltage drop across resistance element R1 decreases, and a source voltage of MOS transistor M1b also lowers. With the lowering in the source voltage, a gate-to-source voltage of MOS transistor M1b increases to increase a current flowing through MOS transistor M1b. Therefore, when control voltage VC lowers, it is suppressed that a current flowing through MOS transistor M1b decreases rapidly.

Accordingly, a backgate bias effect (a substrate effect) in the second embodiment can be suppressed and more correct adjustment of a current amount is accomplished, which makes it possible to implement a linear responsibility of bias voltage VC1 to control voltage VC.

In a case where there is formed mutual connection between the backgate and source of MOS transistor M1b, a backgate bias effect is suppressed, and adjustment in channel impurity concentration is performed by ion implantation or the like into the channel region, in order to adjust a threshold voltage of MOS transistor M1b.

Note that in the configuration shown in FIG. 5 as well, a similar effect can be achieved even if a current source transistor is provided only in one of the power supply node side and the ground node side in each of delay circuits D1 to Dn of ring oscillator OS1.

Furthermore, in a case where a linear responsibility of bias voltage VC1 is implemented in the first to third embodiments, bias voltage VC2 also exhibits a linear responsibility to control voltage VC through bias voltage VC1.

Fourth Embodiment

Figure 6:
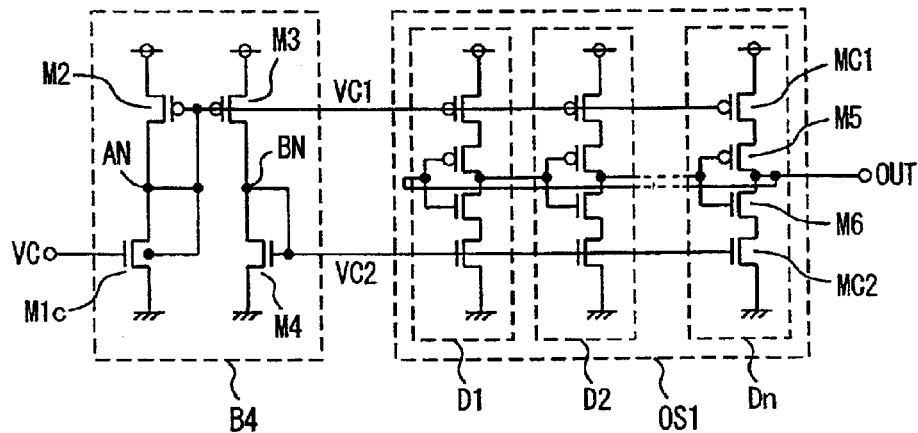
FIG. 6 is a diagram showing a configuration of a voltage controlled oscillation circuit according to a fourth embodiment of the present invention.

FIG. 6 is a diagram showing a configuration of a voltage controlled oscillation circuit according to a fourth embodiment of the present invention. In the voltage controlled oscillation circuit shown in FIG. 6, the backgate of MOS transistor M1c receiving control voltage VC at a gate thereof is connected to an internal node AN in a bias voltage generation circuit B4. The other part of the configuration is the same as that of the configuration shown in FIG. 1, the same reference numerals are attached to corresponding components, and detailed description thereof is omitted.

In the configuration shown in FIG. 6, a backgate bias of MOS transistor M1c is provided by a difference between a voltage of node AN and a voltage of a source node of MOS transistor M1c, that is, a ground voltage.

When the voltage level of control voltage VC rises and a current flowing through MOS transistor M1c increases, a voltage level of node AN lowers. The voltage of node AN is a backgate bias voltage of MOS transistor M1c. Therefore, a backgate bias of MOS transistor M1c becomes deep and a threshold voltage of MOS transistor M1c increases by a backgate bias effect. With increase in the threshold voltage, a current flowing through MOS transistor M1c is suppressed.

On the other hand, when control voltage VC lowers, a current flowing through MOS transistor M1c decreases, and with decrease in the current, a voltage level of node AN rises. A backgate bias voltage of MOS transistor M1c rises and a threshold voltage of MOS transistor M1c decreases by a backgate bias effect (a voltage of node AN is at a positive voltage level), and thus, it is suppressed that a current flowing through MOS transistor M1c decreases.

By use of a voltage level of internal node AN as a backgate bias voltage of MOS transistor M1c, the effect of a resistance element in the second embodiment can be implemented and a linear responsibility of bias voltages VC1 and VC2 to control voltage VC can be provided. Furthermore, no necessity arises for use of a resistance element, thereby enabling an occupancy area for this circuit to be reduced. Moreover, no resistance element is used, thereby enabling suppression of inconvenience such as a change in response characteristic caused by a variation of a resistance value of the resistance element due to fluctuations in fabrication parameters.

Note that in a case where node AN is connected to the backgate of MOS transistor M1c, it is required that a voltage of node AN is adjusted not to exceed a built-in voltage of the PN junction of the source/drain of MOS transistor M1c. For example, the built-in voltage of the PV junction is on the order of 0.6 V, and if a power supply voltage is on the order of 1.2 V, the currents of the same magnitude flow in MOS transistors M2 and M1c with both having substantially the same on-resistance. Therefore it is suppressed that a voltage level of node AN exceeds the built-in voltage of the PN junction. Hence, under the condition of a low power supply voltage, low threshold voltages of MOS transistors can be ensured, thereby enabling a linearity in the response to be acieved.

Note that while, in the configuration shown in FIG. 6, current source transistors are provided in both of the power supply node side and the ground node side in each of delay circuits D1 to Dn, a current source transistor may be provided only in one of both sides.

As described above, according to the fourth embodiment of the present invention, the backgate of a MOS transistor receiving control voltage at a gate thereof is coupled to a drain node of a current mirror current source circuit, thereby enabling achievement of a linear responsibility of a bias voltage to a control voltage without increase in occupancy area by the circuit. Furthermore, by a backgate bias effect, a threshold voltage of an input MOS transistor can be lowered, thereby enabling a wider voltage range of a control voltage to be provided.

Fifth Embodiment

Figure 7:
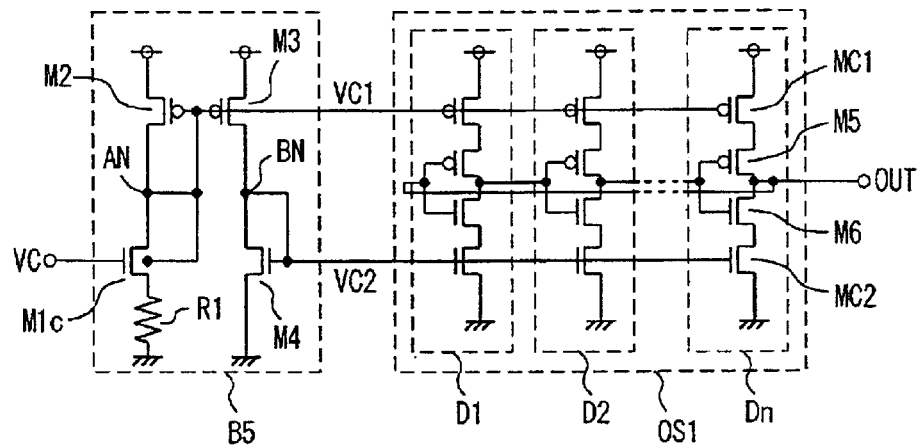
FIG. 7 is a diagram showing a configuration of a voltage controlled oscillation circuit according to a fifth embodiment of the present invention.

FIG. 7 is a diagram showing a configuration of a voltage controlled oscillation circuit according to a fifth embodiment of the present invention. The voltage controlled oscillation circuit shown in FIG. 7 is different in configuration from the voltage controlled oscillation circuit shown in FIG. 6 in the following respect. That is, a resistance element R1 is connected between a source node of an input MOS transistor M1c receiving control voltage VC at a gate thereof and a ground node. The other part of the configuration is the same as that of the configuration of FIG. 6, the same reference numerals are attached to corresponding element and detained description thereof is omitted.

In the configuration shown in FIG. 7, when control voltage VC rises, a drive current of MOS transistor M1c increases and a source voltage of MOS transistor M1c rises due to resistance element R1. At this time, since a conductance of MOS transistor M1c increases, a voltage level of node AN lowers, and with the lowering of the voltage level at node AN, a backgate bias voltage of MOS transistor M1c lowers. Hence, since in MOS transistor M1c, a backgate voltage lowers and a source voltage rises, a backgate-to-source voltage VBS further decreases, a backgate bias effect increases and a threshold voltage of MOS transistor M1c increases, thereby suppressing a current amount flowing through MOS transistor M1c. In this case, a backgate-to-source voltage of MOS transistor M1c is a positive voltage and an effect of decreasing a threshold voltage is not lost.

On the other hand, when control voltage VC falls, a drive current of MOS transistor M1c decreases, with decrease in the drive current, a voltage level of node AN rises and a backgate voltage of MOS transistor M1c rises. At this time, since a current flowing through resistance element R1 decreases, a source voltage of MOS transistor M1c falls. Hence, a backgate-to-source voltage VBS becomes positive, with a backgate bias effect, a threshold voltage of MOS transistor M1c further decreases, thereby suppressing decrease in current flowing through MOS transistor M1c. In this case as well, since the threshold voltage of MOS transistor M1c decreases, a bias voltage can be generated according to a control voltage VC, even though at a low voltage level, thereby enabling a voltage range to be extended.

Accordingly, by use of resistor element R1, the backgate bias effect of MOS transistor M1c due to a voltage of node AN can be enhanced although an occupancy area increases compared with the configuration shown in FIG. 6, thereby enabling a linear responsibility to control voltage VC to be provided to bias voltages VC1 and VC2 with more correctly. Note that this holds for the first embodiment that an oscillation frequency of ring oscillator OS1 is controlled according to bias voltages VC1 and VC2 generated according to control voltage VC.

Note that in the configuration shown in FIG. 7, drain node AN of MOS transistor M1c is connected to the backgate thereof and a backgate voltage is kept at a voltage level equal to or higher than a source voltage at all times. Since a threshold voltage of MOS transistor M1c is caused to be small even with use of resistance element R1 by a backgate bias effect and further, since a voltage drop amount across resistance element R1 decreases in the vicinity of the lower limit of control voltage VC, the lower limit of control voltage VC can be sufficiently decreased. A resistance value of resistance element R1 can be determined appropriately.

Note that in the configuration shown in FIG. 7, a similar effect can be attained even if a current source transistor is provided in one of the power supply node side and the ground node side in each of delay circuits D1 to Dn.

As described above, according to the fifth embodiment of the present invention, an input MOS transistor receiving a control voltage at a gate thereof has the backgate thereof connected to the drain thereof and is connected to a ground node through a resistance element, thereby enabling not only accomplishment of a low threshold voltage but also improvement on a linearity in response of a bias voltage to control voltage.

Sixth Embodiment

Figure 8:
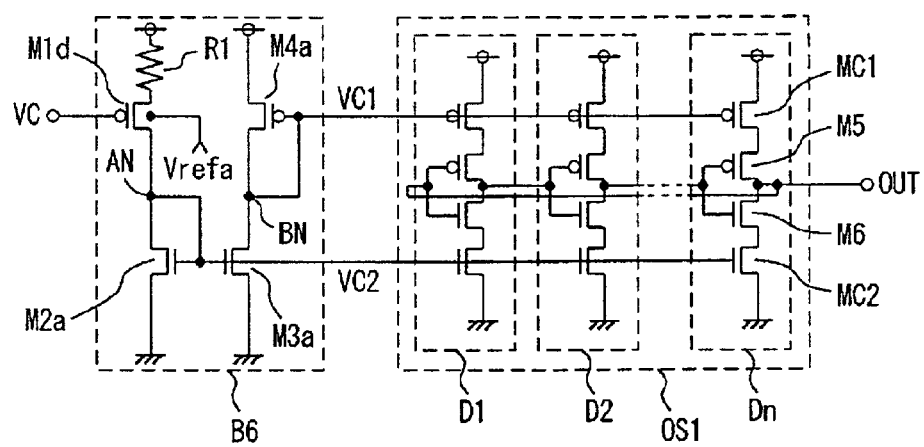
FIG. 8 is a diagram showing a configuration of a voltage controlled oscillation circuit according to a sixth embodiment of the present invention.

FIG. 8 is a diagram showing a configuration of a voltage controlled oscillation circuit according to a sixth embodiment of the present invention. In FIG. 8, the configuration of a bias voltage generation circuit B6 generating bias voltages VC1 and VC2 is different from those of the first to sixth embodiments as described above. That is, in bias voltage generation circuit B6, a current mirror circuit is constituted of MOS transistors M2a and M3a and control voltage VC is applied to a P channel MOS transistor M1d. The source of MOS transistor M1d is connected to a power supply node through resistance element R1 and its drain is connected to node AN. A reference voltage Vrefa is applied to the backgate of MOS transistor M1d. Reference voltage Vrefa is at a voltage level lower than a power supply voltage (Vdd) of a power supply node.

In order to generate bias voltage VC1, a P channel MOS transistor M4a is connected between a power supply node and node BN. P channel MOS transistor M4a has a gate thereof connected to node BN to generate bias voltage VC1. An N channel MOS transistor M3a is connected between node BN and a ground node, and N channel MOS transistors M2a is connected between node AN and a ground. Node AN is connected to the gates of MOS transistors M2a and M3a to generate bias voltage VC2.

Bias voltage generation circuit B6 shown in FIG. 8 is equivalent to a configuration obtained by exchanging the P channel MOS transistors with the N channel MOS transistors and vice versa, and further inverting polarity of each of voltages in bias voltage generation circuit B1 shown in FIG. 1.

Generally, in a P channel MOS transistor, when backgate-to-source voltage VBS changes toward in the positive direction, the absolute value of a threshold voltage increases.

When control voltage VC rises, a conductance of MOS transistor M1d decreases to reduce a current flowing through MOS transistor M1d. With reduction in the current, a voltage drop amount across resistance element R1 decreases to raise a source voltage of MOS transistor M1d. Reference voltage Vrefa is at a voltage level lower than power supply voltage Vdd. Accordingly, a backgate voltage thereof lowers relatively to change a backgate-to-source voltage VBS in the negative direction. Therefore, a backgate bias becomes shallow in MOS transistor M1d to decrease a threshold voltage of MOS transistor M1d and suppress reduction in current amount.

On the other hand, when control voltage VC fails, a conductance of MOS transistor M1d increases to increase a voltage drop amount across resistance element. In this case, a source voltage of MOS transistor M1d lowers, a backgate bias becomes deep and the absolute voltage of a threshold voltage of MOS transistor M1d increases, thereby suppressing a current flowing through MOS transistor M1d to increase.

A current flowing through MOS transistor M1d is reflected by a current mirror circuit constituted of MOS transistors M2a and M3a to generate bias voltage VC1 and VC2. Therefore, in a case where a P channel MOS transistor is used as the input transistor as well, a linearity in response of bias voltages VC1 and VC2 to the control voltage can be improved in a similar manner.

Note that reference voltage Vrefa is so set that a difference between reference voltage Vrefa and a source voltage of MOS transistor M1d is equal to or less than a built-in voltage of the PN junction of the source region.

Since reference voltage Vrefa is at a voltage level lower than power supply voltage Vdd, the absolute value of a threshold voltage of MOS transistor M1d can be smaller, compared with a case where power supply voltage Vdd is applied to the backgate thereof, thereby enabling raising of the upper limit of a voltage range of control voltage VC. In bias voltage generation circuit B6 shown in FIG. 8, when control voltage VC rises, bias voltage VC1 rises while bias voltage VC2 lowers.

Note that a relationship between a threshold voltage and a backgate voltage of a P channel MOS transistor can be obtained by inverting a polarity of backgate voltage VBS in the curve of the graph shown in FIG. 2.

Furthermore, note that in the configuration shown in FIG. 8 as well, a similar effect can be attained even if a current source transistor is provided only in one of the power supply node side and the ground node side in each of delay circuits D1 to Dn of ring oscillator OS1.

Modification

Figure 9:
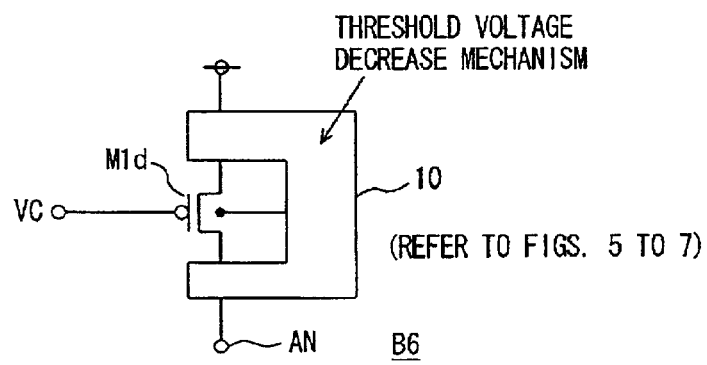
FIG. 9 is a diagram schematically showing an example of a modification of the sixth embodiment of the present invention characteristically.

FIG. 9 is a diagram illustratively showing an example of a modification of the sixth embodiment of the present invention. In FIG. 9, there is shown a portion associated with input MOS transistor M1$d$ in bias voltage generation circuit B6. MOS transistor M1$d$ is coupled to a threshold voltage decrease mechanism 10 and receives control voltage VC at a gate thereof. Threshold voltage decrease mechanism 10 is of a configuration similar to one of the configurations shown in FIGS. 5 to 7, and decrease the absolute value of a threshold voltage of MOS transistor M1$d$. Therefore, a configuration of the threshold voltage decrease mechanism 10 includes one of the following configurations: to mutually connect the back gate and drain of input MOS transistor M1$d$; to connect the source of MOS transistor M1$d$ to a power supply node through resistance R1 and further connect the backgate and drain thereof with each other; and to connect the backgate and drain of MOS transistor M1$d$ to each other and further connect the source thereof to a power supply node through a resistance element. Furthermore, a configuration may be employed in the first embodiment as well that control voltage VC is applied to the gate of a P channel MOS transistor.

Therefore, in the configuration shown in FIG. 9 as well, there can be obtained an effect similar to those of the first and fifth embodiments.

Figure 10:
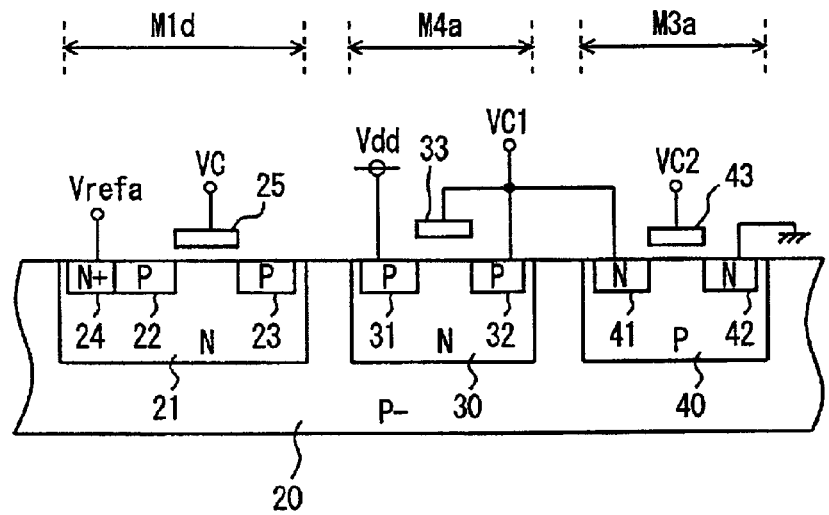
FIG. 10 is a view schematically showing a sectional structure of the bias voltage generation circuit shown in FIG. 8.

FIG. 10 is a diagram schematically showing a sectional structure of the bias voltage generation circuit shown in FIG. 6. In FIG. 10, there are schematically shown sectional structures of MOS transistors M1$d$, M4$a$ and M3$a$ in bias voltage generation circuit.

MOS transistors M1$d$, M4$d$ and M3$a$ are fabricated on a P type substrate 20. MOS transistor M1$d$ is formed in an N type well 21 formed on a surface of P type substrate 20, MOS transistor M4$a$ is formed in an N type well 30 and MOS transistor M3$a$ is formed in a P type well 40 formed on the surface of P type well 20. N type wells 21 and 30 and P type well 40 are formed physically isolated from each other.

MOS transistor M1$d$ includes: P type impurity regions 22 and 23 formed spaced apart from each other on the surface of N type well 2; a gate electrode 25 formed on a channel region between impurity regions 22 and, 23 with a gate insulating film, not shown, interposed in between; and a high concentration N type impurity region formed on the surface of N type well 21, and receiving reference voltage Vrefa. Control voltage VC is applied to gate electrode 25. N type well 21 is biased at reference voltage Vrefa through N type impurity region 24. If P type substrate 20 and N type well 21 are reverse-biased, bias voltage Vrefa of N type well 21 exerts no influence to N type well 30 or P type well 40.

MOS transistor M4$a$ includes: P type impurity regions 31 and 32 formed on the surface of N type well 30, spaced apart from each other; and a gate electrode 33 formed on the surface of a channel region between impurity regions 31 ad 32 with a gate insulating film, not shown, interposed in between. P type impurity region 31 is coupled to a power supply node supplying power supply voltage Vdd, and P type impurity region 32 is connected to gate electrode 33 to generate bias voltage VC1. N type well 30 may be biased at power supply voltage Vdd level. In this case, for example, P type substrate 20 is biased at a ground voltage level.

MOS transistor M3$a$ includes: N type impurity regions 41 and 42 formed on the surface of P type well 40, spaced apart from each other; and an gate electrode 43 formed on a channel region between impurity regions 41 and 42 with a gate insulating film, not shown, interposed in between. N type impurity region 41 is electrically connected to P type impurity region 32, and N type impurity region 42 is electrically connected to a ground node. Bias voltage VC2 is generated at gate electrode 43. In a case where P type well 40 is biased at a ground voltage level, P type substrate 20 is likewise biased at the ground voltage level. In a case where a triple-well structure is employed in which an n type well is formed surrounding P type well 40 in order to bias P type well 40 at a voltage level different from that of P type substrate 20, P type well 40 and P type substrate 20 can be biased at different voltage levels by biasing N type well at a power supply voltage level. The backgate of MOS transistor 3$a$ can be biased at a predetermined voltage.

The structure in which wells of two kinds of conductivity types are formed on the surface of P type substrate 20 as shown in FIG. 10 is called a twin well structure. By use of the twin well structure, transistors of different conductivity types of the circuit B5 shown in FIG. 8 can be fabricated, and substrate biases of P channel MOS transistors M1$d$ and M4$a$ can be effected separately in a different way.

As shown in FIG. 10, by use of a P channel MOS transistor as an input MOS transistor receiving a control voltage VC, element isolation can be achieved only by fabricating N type wells 21 and 30, and P type well 40 spaced apart from each other on P type substrate 20. Accordingly, when compared with a case where N channel MOS transistor is used as the input MOS transistor, no necessity arises for employing a triple-well structure, a fabrication process is simplified and further no need arise for a region for element isolation required in the triple structure, thereby enabling an occupancy area of the circuit to decrease.

As describe above, according to the sixth embodiment of the present invention, a P channel MOS transistor is used as an input MOS transistor receiving a control voltage at a gate thereof, thereby enabling the upper limit of a voltage range of the control voltage to increase. Furthermore, a linearity in response of a bias voltage to a control voltage can be improved. Moreover, a CMOS circuit whose backgate voltage is controlled can be realized in a twin-well structure.

Seventh Embodiment

Figure 11:
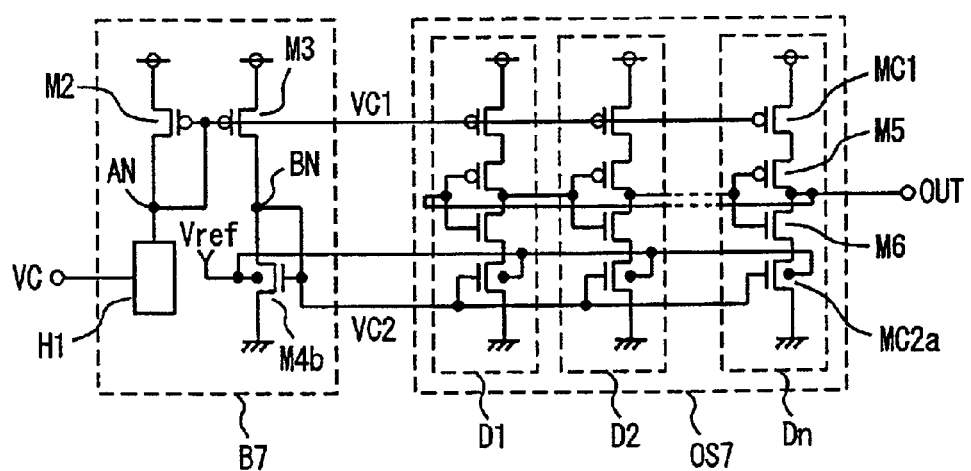
FIG. 11 is a diagram showing a configuration of a voltage controlled oscillation circuit according to a seventh embodiment of the present invention.

FIG. 11 is a diagram showing a configuration of a voltage controlled oscillation circuit according to a seventh embodiment of the present invention. In FIG. 11, a bias voltage generation circuit B7 includes: a voltage/current conversion section H1 for converting control voltage VC to a current; P channel MOS transistors M2 and M3 constituting a current mirror circuit; and N channel MOS transistors M4$b$ supplied with a current from MOS transistor M3 to generate a bias voltage VC2.

Voltage/current conversion section H1 has one of the configurations described in the first to sixth embodiments and the absolute value of a threshold voltage thereof is set as small as possible.

On the other hand, reference voltage Vref is applied to the backgate of N channel MOS transistor M4b generating bias voltage VC2. Reference voltage Vref is at a prescribed level and in a case where a reference voltage is used in voltage/current conversion section H1, reference voltage Vref may be set at the same level as the reference voltage in voltage/current conversion section H1, or may be set differently from the reference voltage in voltage/current conversion section H1. For example, in a case where a resistance element and a reference voltage are used in voltage/current conversion section H1, a backgate voltage Vref of MOS transistor M4b may be set in consideration of a voltage drop across the resistance element.

In bias voltage generation circuit B7, bias voltage VC1 is generated according to a voltage level of node AN.

A oscillation frequency of a ring oscillator OS7 is controlled according to bias voltages VC1 and VC2. Ring oscillator OS7 includes delay circuits D1 to Dn having the respective operating currents determined by bias voltages VC1 and VC2, and connected in a ring shape. In each of delay circuits D1 to Dn, N channel MOS transistor MC2a serving as a current source receives bias voltage VC2 at a gate thereof and receives reference voltage Vref at a backgate thereof, and bias voltage VC1 is applied common to the gates of the other current source transistor MC1 connected to the power supply node. Furthermore, in each of delay circuits D1 to Dn, MOS transistors M5 and M6 connected between current source transistors MC1 and MC2a receive, at the gates thereof, an output signal of a delay circuit at the preceding stage.

In the configuration of the voltage controlled oscillation circuit shown in FIG. 11, voltage levels of bias voltages V1 and V2 change according to control voltage VC, and according to changes in voltage level, an oscillation frequency of ring oscillator OS7 is controlled. Positive reference voltage Vref is applied to the backgate of MOS transistor M4b generating bias voltage VC2, and a threshold voltage of MOS transistor M4b is decreased compared with a case where a source node thereof is connected to the ground node.

Similarly, in ring oscillator OS7, reference voltage Vref is applied commonly to the backgates of MOS transistors MC2a, which are the current sources in the ground node side, to decrease threshold voltages of MOS transistors MC2a of the current sources.

In the configuration of FIG. 11, by the use of voltage/current conversion section H1, a voltage range of control voltage VC can be extended. Furthermore, by applying voltage Vref to the backgates of MOS transistors M4b and MC2a, threshold voltages thereof are decreased Under the condition of a low power supply voltage, MOS transistor M4b stably operates in a saturation region to generate bias voltage VC2. Furthermore, MOS transistors MC2a of the current source, too, each surely supply an operating current according to bias voltage VC2 even under the condition of a low power supply voltage. Hence, under application of a low power supply voltage, too, bias voltage VC2 can be stably generated to operate ring oscillator OS7, thereby enabling a current characteristic at a low power supply voltage to be improved.

Modification Example

Figure 12:
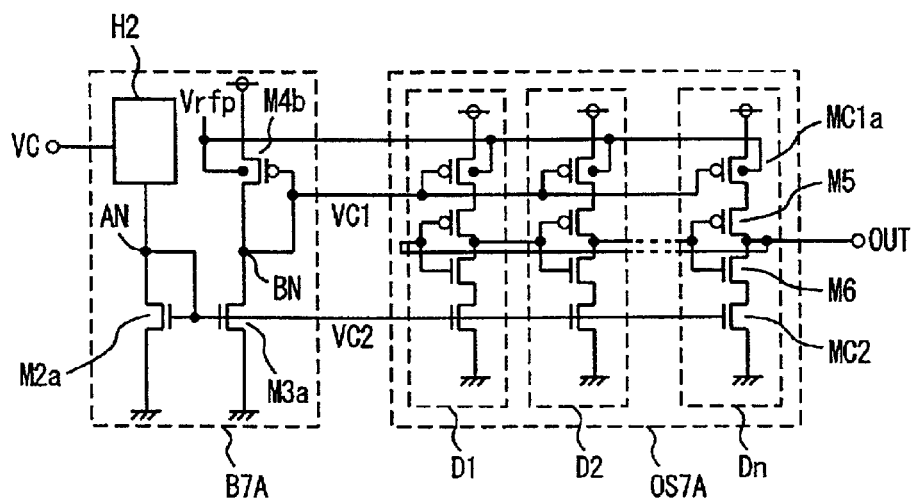
FIG. 12 is a diagram showing an example of a modification of the seventh embodiment of the present invention.

FIG. 12 is a diagram showing an example of a modification of the voltage controlled oscillation circuit according to the seventh embodiment of the present invention. In a configuration shown in FIG. 12, a bias voltage generation circuit B7A includes: a voltage/current conversion section H2 converting control voltage VC to a current; MOS transistors M2a and M3a constituting a current mirror circuit supplying a current according to a supply current of a voltage/current conversion section H2; and a P channel MOS transistor M4b coupled to MOS transistor M3a, and generating bias voltage VC1 according to a drive current of MOS transistor M3a.

Voltage/current conversion section H2 receives control voltage VC at a gate thereof, similar to the configuration shown in FIG. 8. Voltage/current conversion section H2 may be of any configuration as long as it causes the absolute value of a threshold voltage of a P channel MOS transistor to be small, and any of the configurations shown in FIGS. 8 and 9 may be employed.

Reference voltage Vrefp is applied to the backgate of MOS transistor M4b. Reference voltage Vrefp is at a voltage level lower than that of power supply voltage (Vdd) and the absolute value of a threshold voltage of MOS transistor M4b is decreased, compared with a case where the source thereof is connected to the power supply node.

In a ring oscillator OS7A, reference voltage Vrefp is applied to the backgate of P channel MOS transistor MC1a in each of delay circuits D1 to Dn. Bias voltage VC1 is applied to the gates of current source transistors MC1a. Bias voltage VC2 is applied to the gates of current source transistors MC2 in the ground node side opposite to the power supply node side.

In the case of the configuration shown in FIG. 12, P channel MOS transistor M4b surely operates in a saturation region even at a low power supply voltage to generate bias voltage VC1. Furthermore, in each of delay circuits D1 to Dn of ring oscillator OS7A, since the absolute value of a threshold voltage of P channel MOS transistor MC1a of a current source is decreased, an operating current can be stably supplied according to bias voltage VC1 even in a case where an operating power supply voltage of each of delay circuits D1 to Dn is low. Therefore, even under the condition of a low power supply voltage, the upper limit of control voltage VC can be increased, thereby enabling the voltage range to be extended accordingly.

Furthermore, in the upper limit region of bias voltage VC1 as well, current source transistor MC1a can be stably operated to correctly control an oscillation frequency of ring oscillator OS7A according to control voltage VC. Therefore, under the condition of a low power supply voltage, a voltage controlled oscillation circuit can be achieved that implements a phase locked circuit with a wide voltage range and a wide frequency range for stable operation.

Note that in the configurations shown in FIGS. 11 and 12, configurations similar to ones in the conventional configuration may be employed as voltage/current conversion sections H1 and H2. In this case as well, a voltage range of the bias voltage VC1 or VC2 can be extended, thereby enabling a current characteristic to be improved in a similar manner.

Furthermore, note that, in the configurations shown in FIGS. 11 and 12 as well, a similar effect can be attained even if a current source transistor is provided only in one of the power supply node side and the ground node side in each of delay circuits D1 to Dn.

As described above, according to the seventh embodiment of the present invention, a prescribed reference voltage is provided to the back gate of a MOS transistor generating a bias voltage, and further, a similar reference voltage is provided to the backgates of current source transistors of delay circuits of a ring oscillator to decrease the absolute value of the threshold voltages, thereby enabling implementation of a voltage controlled oscillation circuit excellent in current characteristic, and operating stably even under the condition of a low power supply voltage.

Eighth Embodiment

Figure 13:
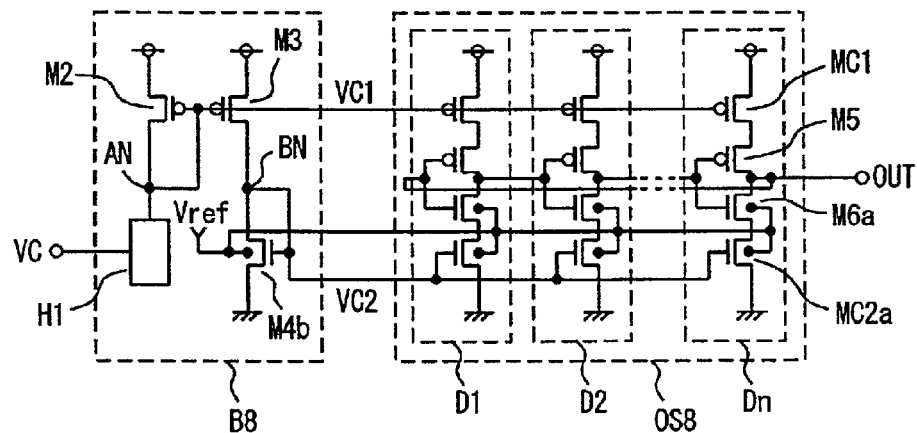
FIG. 13 is a diagram showing a configuration of a voltage controlled oscillation circuit according to an eighth embodiment of the present invention.

FIG. 13 is a diagram showing a configuration of a voltage controlled oscillation circuit according to an eighth embodiment of the present invention. The voltage controlled oscillation circuit shown in FIG. 13 is different from the voltage controlled oscillation circuit shown in FIG. 11 in configuration in the following respect. That is, in each of delay circuits D1 to Dn of a ring oscillator OS8, reference voltage Vref is applied commonly to the backgates of N channel MOS transistors M6a each receiving an output signal of a delay circuit at the preceding stage. The other part of the configuration is the same as that of the configuration of the voltage controlled oscillation circuit shown in FIG. 11, the same reference numerals are attached to corresponding components, and detailed description thereof is omitted.

In the configuration shown in FIG. 13, reference voltage Vref is applied commonly to MOS transistors M4b, MC2 and M6a. Therefore, the absolute values of threshold voltages of N channel MOS transistors M4b, MC2a and M6a are decreased. Hence, in each of delay circuits D1 to Dn of ring oscillator OS8, a fall time of an output signal of the delay circuit can be reduced under the condition of the same operating current, and responsively, a delay time can be reduced. Therefore, a frequency range in which the frequency can be varied, can be extended, and not only a voltage range but also a frequency range can be extended.

Note that in the configuration shown in FIG. 13 as well, reference voltage Vrefp may be applied to drive P channel MOS transistor M5 in each of delay circuits D1 to Dn by use of bias voltage generation circuit shown in FIG. 12.

Furthermore, note that, in the configurations shown in FIG. 13 as well, a similar effect can be attained even if a current source transistor is provided only in one of the power supply node side and the ground node side in each of delay circuits D1 to Dn.

As described above, according to the eighth embodiment of the present invention, reference voltage at a prescribed voltage level is applied to the backgate of a delay MOS transistor for operation of each in the delay circuits of a ring oscillator and a threshold voltage thereof is deceased, which can extend not only a range in which an operating speed of a reference circuit can be changed but also a frequency range, in addition to realization of improvement on current characteristic under application of a low power supply voltage.

Ninth Embodiment

Figure 14:
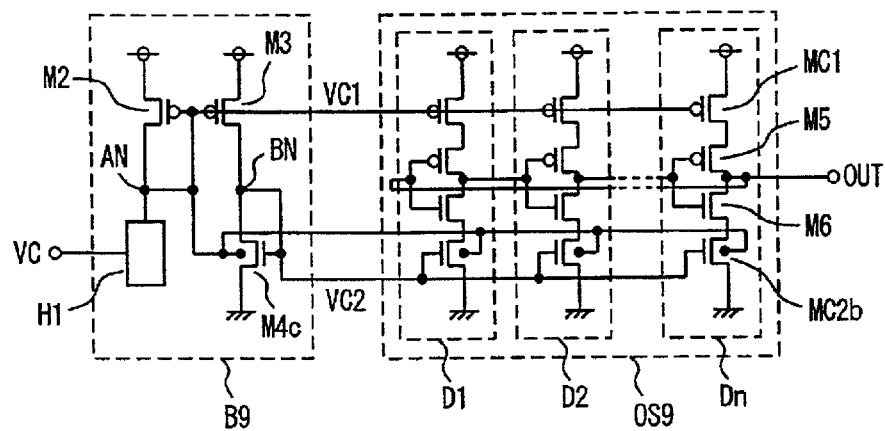
FIG. 14 is a diagram showing a configuration of a voltage controlled oscillation circuit according to a ninth embodiment of the present invention.

FIG. 14 is a diagram showing a configuration of a voltage controlled oscillation circuit according to a ninth embodiment of the present invention. A configuration shown in FIG. 14 is different from the voltage controlled oscillation circuit shown in FIG. 13 in configuration in the following respect: That is, in a bias voltage generation circuit B9, the backgate of a MOS transistor M4c generating bias voltage VC2 is connected to node AN. Furthermore, in a ring oscillator OS9, an N channel MOS transistor MC2b of a current source in each of delay circuits D1 to Dn is connected to node AN. The other part of the configuration is the same as that of the voltage controlled oscillation circuit shown in FIG. 11, the same reference numerals are attached to corresponding constituents and detailed description thereof is omitted.

That is, in the configuration shown in FIG. 14, a voltage of node AN is used instead of the reference voltage. A threshold voltage is dynamically changed according to reference voltage VC1 to suppress a rapid change in current.

Figure 15:
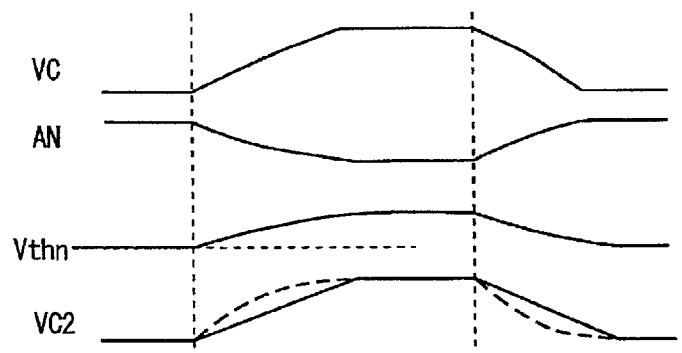
FIG. 15 is a graph illustratively showing a relationship between a control voltage and a bias voltage in the configuration shown in FIG. 14.

FIG. 15 is a signal waveform diagram showing a relationship between a control voltage and a bias voltage VC2 in the voltage controlled oscillation circuit shown in FIG. 14. As shown in FIG. 15, when control voltage VC rises, a voltage level of node AN falls. When a voltage level of node AN falls, backgate voltages of MOS transistors M4c and MC2b fall to thereby cause a backgate bias to be deeper and increase threshold voltages Vthn of MOS transistors M4c and MC2b. Therefore, with increase in the threshold voltages, a rapid change in bias voltage VC2 is suppressed to change almost linearly.

In MOS transistor MC2b of a current source, a backgate bias thereof is in the same state as that of MOS transistor M4c generating bias voltage VC2, and both transistors each drive a current of the same magnitude if their sizes (a ratio of a gate length to a channel width) are the same with each other.

On the other hand, when control voltage VC lowers, a voltage level of node AN rises. With a rise in voltage of node AN, a backgate bias of MOS transistor M4c becomes shallow to decrease a threshold voltage Vthn thereof. Therefore, in a case where with a rise in control voltage VC, bias voltage VC1 rises and at the same time, currents flowing through MOS transistors M3 and M4c decrease, a threshold voltage of MOS transistor M4c becomes small to increase a supply current. Thus, a large change in voltage of node BN can be suppressed, which enables improvement on linearity in response to control voltage VC of bias voltage VC2 from node BN.

At this time, since, in each of delay circuits D1 to Dn, an operating current changes linearly according to control voltage VC through MOS transistor MC2b, an oscillation frequency of ring oscillator OS9 can be correctly controlled according to control voltage VC.

Note that in the configuration shown in FIG. 14 as well, voltage/current conversion section H1 may be provided in the P channel MOS transistor side. In this configuration, a backgate voltage of P channel MOS transistor MC1 as a current source is adjusted according to a voltage level of node AN by ring oscillator OS9.

Furthermore, in the configuration shown in FIG. 14, a current source transistor in each of delay circuits D1 to Dn may be provided only in one of the power supply node side and the ground node side.

As described above, according to the ninth embodiment of the present invention, the backgate of MOS transistor generating a bias voltage and N channel MOS transistors of current sources in delay circuits are configured so as to receive a voltage that changes according to control voltage. Thus, in addition to an effect of decreasing a threshold voltage, improvement on a current characteristic under the condition of a low power supply voltage and furthermore can be achieved, and a linear responsibility of a bias voltage to a control voltage can be also achieved.

Tenth Embodiment

Figure 16:
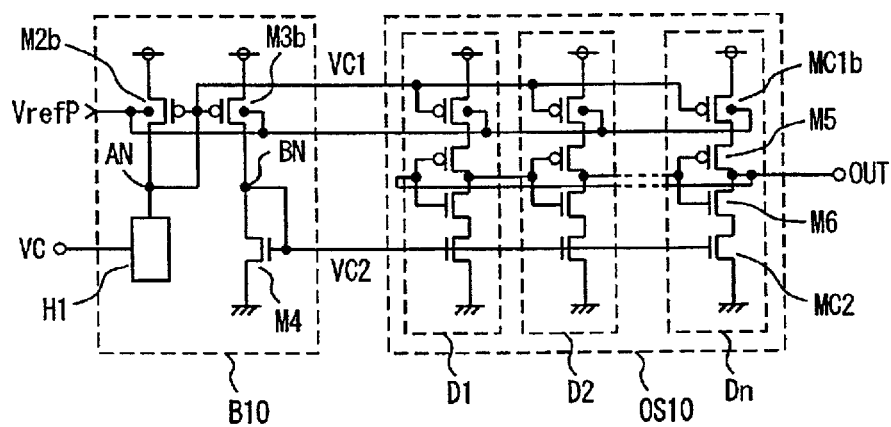
FIG. 16 is a diagram showing a configuration of a voltage controlled oscillation circuit according to a tenth embodiment of the present invention.

FIG. 16 is a diagram showing a configuration of a voltage controlled oscillation circuit according to a tenth embodiment of the present invention. In a configuration of a bias voltage generation circuit B10 shown in FIG. 16, reference voltage Vrefp at a prescribed voltage level different from that of a power supply voltage is applied to the backgates of P channel MOS transistors M2b and M3b constituting a current mirror circuit of a current source. Furthermore, in each of delay circuits D1 to Dn of a ring oscillator OS10, a P channel MOS transistor MC1b of a current source receives bias voltage VC1 at a gate thereof and reference voltage Vrefp at a backgate thereof. Bias voltage Vrefp is at a voltage level lower than a power supply voltage to decrease the absolute values of threshold voltages of current source transistors MC2b, MC3b and MC1b.

Bias voltage generation circuit B10 further includes: a voltage/current conversion section H1 converting control voltage VC2 to current information; and an N channel MOS transistor M4 generating bias voltage VC2 according to a current from MOS transistor M3b.

Each of delay circuits D1 to Dn of a ring oscillator OS10 includes: MOS transistors M5 and M6 receiving an output signal from a delay circuit at the preceding stage; and an N channel MOS transistor MC2 of a current source receiving bias voltage VC2 at a gate thereof.

In the configuration of voltage controlled oscillation circuit shown in FIG. 16, bias voltages VC1 and VC2 change according to control voltage VC to control an oscillation frequency of ring oscillator OS10. A wide voltage range of control voltage VC can be achieved by voltage/current conversion section H1. Note that in the configuration of voltage/current conversion section H1 shown in FIG. 16, the backgate of an N channel MOS transistor receiving control voltage VC at a gate thereof is coupled to the source thereof to suppress an backgate bias effect.

Reference voltage Vrefp, as described above, is at a voltage level lower than that of a power supply voltage of a power supply node to decrease the absolute values of threshold voltages of P channel MOS transistors M2b and M3b. Therefore, under the condition of a low power supply voltage as well, MOS transistors M2b and M3b constituting the current mirror circuit can be stably operated in a saturation region, thereby enabling improvement on current characteristic of MOS transistors M2b and M3b under the condition of a low power supply voltage.

Furthermore, in ring oscillator OS10 as well, the absolute value of a threshold voltage of current source P channel MOS transistor MC1b in each of delay circuits D1 to Dn becomes small, and with decrease in absolute value of the threshold voltage. Thus, a current characteristic of the current source transistor under the condition of a low power supply voltage is improved, to improve current characteristics of all of MOS transistors MC1b or delay circuits D1 to Dn in a region in the vicinity of the upper limit of bias voltage VC1, thereby enabling ring oscillator OS10 to operate stably over a wide voltage range.

In voltage/current conversion section H1, a backgate voltage of an N channel MOS transistor is the same as the source voltage thereof and reference voltage is not applied to the backgate thereof Only backgate voltages of P channel MOS transistors M2b and M3b and MC1b are set to reference voltage Vrefp and no necessity arises for a triple-well structure to isolate a P channel MOS transistor and an N channel MOS transistor from each other, similar to the structure shown in FIG. 10, thereby enabling reduction in circuit occupancy area together with simplification of a fabrication process.

Note that in the configuration shown in FIG. 16, in a case where voltage/current conversion section H1 is provided in the P channel MOS transistor side, and a mirror current circuit is constituted of N channel MOS transistors as well, a similar effect can also be achieved when a reference voltage higher than the ground voltage is applied to the backgates of the MOS transistors constituting the current mirror circuit, and further reference voltage is applied to the backgate of a current source N channel MOS transistor in the ground side of each of the delay circuits, similar to the configuration shown in FIG. 16. In the case of this configuration, a current characteristic of a control voltage in a high voltage region can be improved and at the same time, a current characteristic of delay circuits in a low voltage region can be improved.

In the configuration shown in FIG. 16 as well, a current source transistor in each of delay circuits D1 to Dn may be provided only in one of the power supply node side and the ground node side.

As described above, according to the tenth embodiment of the present invention, a prescribed reference voltage is applied to the backgates of MOS transistors constituting a current mirror circuit and to backgates of MOS transistors constituting respective current sources in delay circuits to decrease the absolute values of threshold voltages thereof, thereby, enabling improvement on current characteristics thereof under the condition of a low power supply voltage, and further enabling implementation of a voltage controlled oscillation circuit with a wide voltage range.

Eleventh Embodiment

Figure 17:
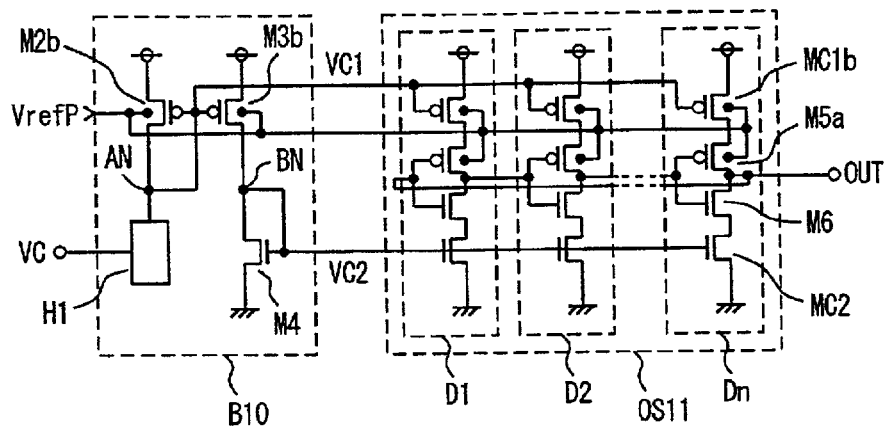
FIG. 17 is a diagram showing a configuration of a voltage controlled oscillation circuit according to an eleventh embodiment of the present invention.

FIG. 17 is a diagram showing a configuration of a voltage controlled oscillation circuit according to an eleventh embodiment of the present invention. The voltage controlled oscillation circuit shown in FIG. 17 is different from the voltage controlled oscillation circuit shown in FIG. 16 in the following respect. That is, in each of delay circuits of a ring oscillator OS11, reference voltage Vrefp is applied commonly to the backgate of P channel MOS transistor M5a receiving an output signal of the delay circuit at the preceding stage and to the backgate of P channel MOS transistor MC1 of current source.

The configuration of bias voltage generation circuit B10 is the same as that of the bias voltage generation circuit shown in FIG. 16. The other part of the configuration of a ring oscillator OS11 is the same as that of the configuration shown in FIG. 16, the same reference numerals are attached to corresponding components and detailed description thereof is omitted.

In the configuration of the voltage controlled oscillation circuit shown in FIG. 17, reference voltage Vrefp at a prescribed level is applied to the backgate of each P channel MOS transistor M5a receiving an output signal of a delay circuit at the preceding stage to decrease the absolute value of a threshold voltage of MOS transistor M5a. Hence, the following effect is provided, in addition to the effect of the tenth embodiment shown in FIG. 16.

That is, since MOS transistor M5a is decreased in absolute value of a threshold voltage, an operating speed thereof becomes faster under the same gate voltage condition. Therefore, there can be extended a range of oscillation frequency of ring oscillator OS11 that changes according to bias voltages VC1 and VC2, thereby enabling a frequency range of a phase locked loop to be extended.

Note that in the configuration of the voltage controlled oscillation circuit shown in FIG. 17 as well, voltage/current conversion section H1 may be provided in the P channel MOS transistor side. In this case, a reference voltage is applied commonly to the backgates of N channel MOS transistors M6 and MC2 in each of delay circuits and further, a reference voltage is applied to the backgates of the N channel MOS transistor constituting a current mirror circuit in a bias voltage generation circuit, too.

Furthermore, note that, in the configurations shown in FIG. 17 as well, a similar effect can be attained even if a current source transistor is provided only in one of the power supply node side and the ground node side in each of delay circuits D1 to Dn.

Twelfth Embodiment

Figure 18:
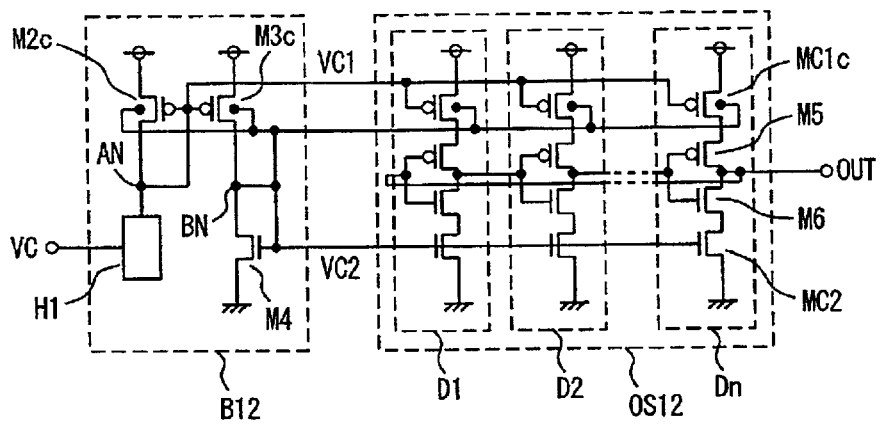
FIG. 18 is a diagram showing a configuration of a voltage controlled oscillation circuit according to a twelfth embodiment of the present invention.

FIG. 18 is a diagram showing a configuration of a voltage controlled oscillation circuit according to a twelfth embodiment of the present invention. In a configuration shown in FIG. 18, the backgates of P channel MOS transistors M2c and M3c constituting a current mirror circuit are connected to node BN in a bias voltage generation circuit B12. In each of delay circuits of a ring oscillator OS12, the backgate of a P channel MOS transistor MC1c of a current source is connected to node BN. That is, in the voltage controlled oscillation circuit shown in FIG. 18, a voltage of node BN is employed as a backgate voltage instead of reference voltage Vrefp of the voltage controlled oscillation circuit shown in FIG. 16.

Figure 19:
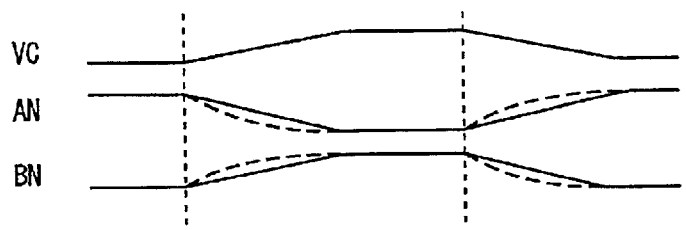
FIG. 19 is a graph illustratively showing a relationship between a control voltage and a bias voltage in the configuration shown in FIG. 18.

The other part of the configuration is the same as that of the configuration shown in FIG. 16, the same reference numerals are attached to corresponding components and detailed description thereof is omitted, FIG. 19 is a graph illustratively showing a relationship between a control voltage VC and the voltages at nodes AN and BN in the configuration shown in FIG. 18. As shown in FIG. 19, when control voltage VC rises, a voltage of node AN, or a bias voltage VC1 lowers. The voltage level of node AN is to change according to a square function curve as shown by the dotted curve. A current supplied by MOS transistor M3c also changes and a voltage of node BN rises according to a change in voltage of node AN. When a voltage level of node BN rises, then backgate biases of P channel MOS transistors M2c and M3c becomes deep to increase the absolute values of their respective threshold voltages, supply current amounts of MOS transistors M2c and M3c decrease to slow down a falling speed of a voltage of node AN and further, with slow down of the falling speed, a speed of change in voltage of node BN is slowed down. Therefore, bias voltages VC1 and VC2 change linearly with control voltage VC as shown by the solid curve.

When control voltage VC lowers, a voltage level of node AN rises to decrease supply currents of MOS transistors M2c and M3c. In this case, a voltage level of node BN lowers, and with the decrease in voltage level, backgate biases of MOS transistors M2c and M3c becomes shallow to decrease the absolute values of their respective threshold voltages and increase their supply current amounts. Therefore, in this case as well, speeds of change in voltage of nodes AN and BN are slowed down to implement a linear responsibility of each of bias voltages VC1 and VC2 to control voltage VC in a similar manner.

Accordingly, bias voltages VC1 and VC2 change linearly with control voltage VC and with the linear change of the bias voltages, improvement is achieved on a linear responsibility of an oscillation frequency to control voltage of delay circuits D1 to Dn.

Note that, in the configuration shown in FIG. 18 as well, voltage/current conversion section H1 may be provided in the power supply side. In voltage/current conversion section H1, no backgate control is performed on an N channel MOS transistor receiving control voltage VC at the gate thereof. This is because a necessity arises for a triple-well structure in a case where control is to be made on the backgates of both of a P channel MOS transistor and an N channel MOS transistor.

Furthermore, in the configuration shown in FIG. 18 as well, a current source transistor of each of delay circuits D1 to Dn may be provided only in one of the power supply node side and the ground node side.

As described above, according to the twelfth embodiment of the present invention, the backgates of transistors as a current source of a bias voltage generation circuit and transistors as current sources in ring oscillator OS12 are configured so as to supply bias voltages of the other current sources in the bias voltage generation circuit and ring oscillator OS12, and a threshold voltage of each MOS transistor as a current source is negatively fed back, thereby enabling a linear responsibility of a bias voltage to a control voltage to be realized.

Furthermore, adjustment is performed only on a substrate bias of a P channel MOS transistor as a current source, no necessity arises for a triple-well structure for isolation between regions of P channel MOS transistor and an N channel MOS transistor.

Thirteenth Embodiment

Figure 20:
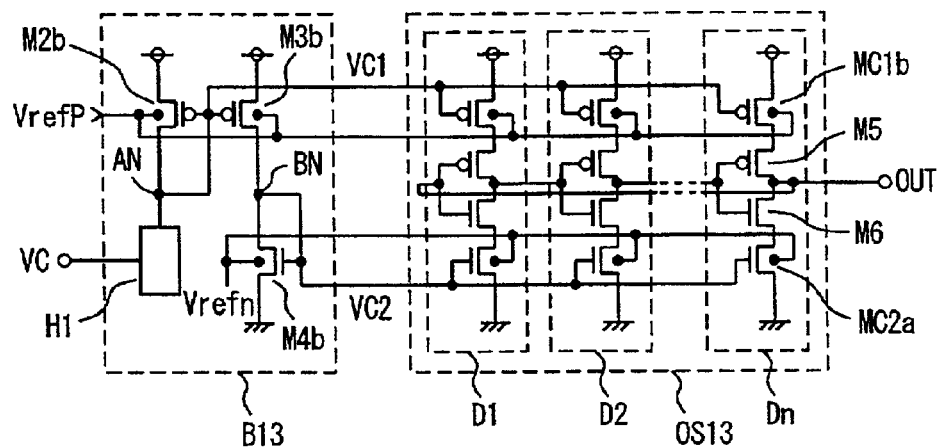
FIG. 20 is a diagram showing a configuration of a voltage controlled oscillation circuit according to a thirteenth embodiment of the present invention.

FIG. 20 is a diagram showing a configuration of a voltage controlled oscillation circuit according to a thirteenth embodiment of the present invention. In a bias voltage generation circuit B13 shown in FIG. 20, reference voltage Vrefp at a prescribed voltage level is applied to the backgates of P channel MOS transistors M2b and M3b constituting a current mirror circuit. A reference voltage Vrefa is applied to the backgate of an N channel MOS transistor generating bias voltage VC2.

In a ring oscillator OS13, reference voltage Vrefp is applied to the backgate of a P channel MOS transistor MC1b of a current source in the power supply side in each of delay circuits, and reference voltage Vrefn is applied to the backgate of an N channel MOS transistor MC2a of a current source in the ground side opposite to the power supply side in a corresponding one of delay circuits.

The configuration shown in FIG. 20, therefore, corresponds to a combination of the voltage controlled oscillation circuit shown in FIG. 14 and the voltage controlled oscillation circuit shown in FIG. 16. The same reference numerals are attached to corresponding components to those in the figures and detailed description thereof is omitted.

In the case of the configuration of the voltage controlled oscillation circuit shown in FIG. 20, the absolute values of threshold voltages of P channel MOS transistors M2b and M3b are decreased and further a threshold voltage of N channel MOS transistor M4b is also decreased in bias voltage generation circuit B13. In voltage/current conversion circuit H1 as well, a threshold voltage of an N channel MOS transistor receiving control voltage VC at the gate thereof is decreased. Therefore, a voltage range of bias voltage generation circuit B13 can be extended and bias voltage generation circuit B13 can be stably operated under the condition of a low power supply voltage to generate bias voltages VC1 and VC2 according to a control voltage.

In each of delay circuits of a ring oscillator OS13, the absolute values of threshold voltages of P channel MOS transistor MC1b and an N channel MOS transistor MC2a, each serving as a current source are decreased to stably operate ring oscillator OS13 under the condition of a low power supply voltage as well.

Furthermore, improvement is achieved on a linearity in response of bias voltages VC1 and VC2 to control voltage VC and in addition, operating conditions of current source MOS transistors MC1 and MC2, and drive (delay) transistors M5 and M6 can be made the same with each other and delay circuits D1 to Dn each can be operated correctly according to an operating current determined by bias voltages VC1 and VC2, thereby enabling an oscillation frequency of ring oscillator OS13 to be controlled according to control voltage VC.

Note that in the configuration shown in FIG. 20, the configuration of voltage/current conversion section H1 may be similar to the one in the conventional circuit.

Voltage levels of reference voltages Vrefp and Vrefn each have only to be a voltage level at which a PN junction of the backgate of a corresponding MOS transistor is not biased in the forward direction, and reference voltages Vrefp and Vrefn may be set at a half times a power supply voltage or Vdd/2. Furthermore, reference voltages Vrefp and Vrefn may be at voltage levels different from each other. For example, reference voltage Vrefp may be set to a built-in voltage Vpn of the PN junction and reference voltage Vrefn may be set to a value of voltage Vdd–Vpn.

Note that, in the configuration shown in FIG. 20, voltage/current conversion circuit H1 may be provided in the power supply side.

Furthermore, note that a similar effect can be attained even if a current source transistor is provided only in one of the power supply node side and the ground node side in each of delay circuits D1 to Dn.

As described above, according to the thirteenth embodiment of the present invention, the configuration is such that a prescribed voltage level is applied to the backgates of MOS transistors related to bias voltages and a wide voltage range can be achieved even under the condition of a low power supply voltage, thereby enabling improvement on a current characteristic over a wide voltage range.

Fourteenth Embodiment

Figure 21:
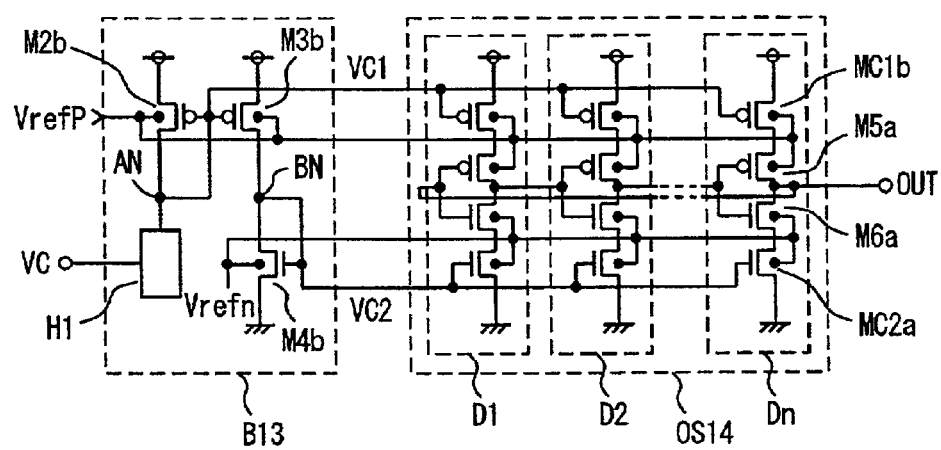
FIG. 21 is a diagram showing a configuration of a voltage controlled oscillation circuit according to a fourteenth embodiment of the present invention.

FIG. 21 is a diagram showing a configuration of a voltage controlled oscillation circuit according to a fourteenth embodiment of the present invention. The voltage controlled oscillation circuit shown in FIG. 21 is different in configuration from the voltage controlled oscillation circuit shown in FIG. 20 in the following respect. That is, in each of delay circuits D1 to Dn of a ring oscillator OS14, reference voltage Vrefp is applied to the backgate of a P channel MOS transistor M5a driving a corresponding internal output node according to an output signal of a delay circuit at the preceding stage and further, reference voltage Vrefn is applied to the backgate of a drive N channel MOS transistor M6a driving the corresponding internal output node. The other part of the configuration is the same as that of the configuration shown in FIG. 20, the same reference numerals are attached to corresponding components and detailed description thereof is omitted.

In the configuration of the voltage controlled oscillation circuit shown in FIG. 21, the absolute values of threshold voltages of current source transistors are decreased under the condition of a low power supply voltage. Furthermore, in a bias voltage generation circuit B13 as well, the absolute values threshold voltages of MOS transistors of the components are decreased, thereby enabling a stable operation even under the condition of a low power supply voltage.

In each of delay circuits D1 to Dn, reference voltages Vrefp and Vrefn are also applied to the backgates of respective drive MOS transistors M5a and M6a to decrease threshold voltages thereof. Therefore, operating characteristics of the delay circuits D1 to Dn are improved to extend an oscillation frequency range of ring oscillator OS14, thereby enabling a frequency range of a phase locked loop using the voltage controlled oscillation circuit to be extended.

Note that in the configuration shown in FIG. 21, reference voltages Vrefp and Vrefn are employed. However, it may be allowed that bias voltage VC2 is applied to the backgates of P channel MOS transistors M2b, M3b, MC1b and M5a, while reference voltage Vrefn may be applied to the backgates of N channel MOS transistors M4b, M2a and M6a.

Furthermore, alternatively, it may be allowed that bias voltage VC1 is applied to the backgates of N channel MOS transistors M4b, MC2a and M6a, while reference voltage Vrefp is applied to the backgates of P channel MOS transistors M2b, M3b, MC1b and M5a.

In the configuration shown in FIG. 21, voltage/current conversion section H1 may be provided in the power supply side instead of the ground side.

Furthermore, note that a similar effect can be attained even if a current source transistor is provided only in one of the power supply node side and the ground node side in each of delay circuits D1 to Dn.

As described above, according to the fourteenth embodiment of the present invention, in each of delay circuits, a prescribed voltage is applied to the backgates of transistors of the current sources and similarly a backgate bias voltage is applied to drive transistors. Thus, not only a voltage range but also a frequency range can be extended under the condition of a low power supply voltage.

Fifteenth Embodiment

Figure 22:
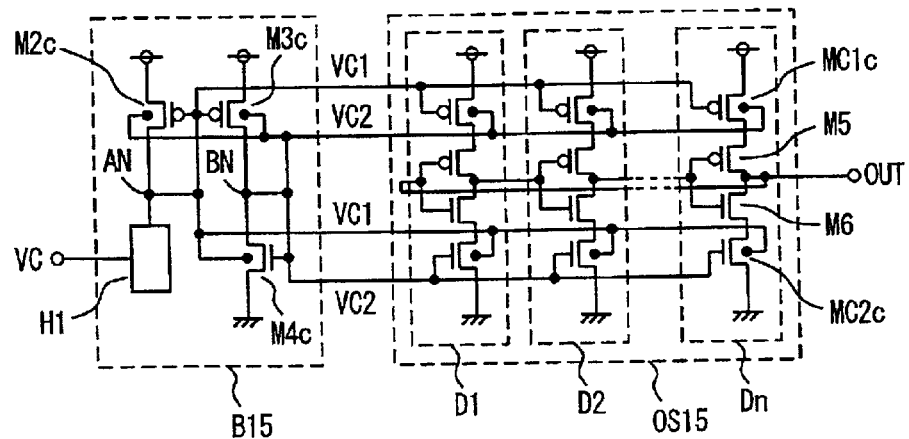
FIG. 22 is a diagram showing a configuration of a voltage controlled oscillation circuit according to a fifteenth embodiment of the present invention.

FIG. 22 is a diagram showing a configuration of a voltage controlled oscillation circuit according to a fifteenth embodiment of the present invention. In a bias voltage generation circuit B15 of FIG. 22, a P channel MOS transistors M2c and M3c constituting a current mirror circuit is connected to node BN and the backgate of an N channel MOS transistor M4c generating bias voltage VC2 is connected to node AN.

In each of the delay circuits of a ring oscillator OS15, a P MOS channel MOS transistor MC1c of a current source is electrically connected to receive the bias voltage VC1 at a gate thereof and to receive the reference voltage VC2 at a backgate thereof. Similarly, an N channel MOS transistor MC2c of a current source has a backgate thereof connected to node AN to receive bias voltage VC1 thereat. The other part of the configuration shown in FIG. 22 is the same as that of the configuration shown in FIG. 20, the same reference numerals are attached to components corresponding to those of FIG. 20 and detailed description thereof is omitted.

In the configuration shown in FIG. 22 as well, a linear responsibility of bias voltages VC1 and VC2 to control voltage VC can be implemented. Furthermore, since in each of the delay circuits of ring oscillator OS15, current source transistors MC1c and MC2c receive the bias voltages VC2 and VC1 at their respective backgates and are set in the same backgate bias state as the MOS transistors at the master stage of corresponding mirror current circuits, current characteristics thereof can be the same as that of the master transistors of the current mirror circuits, thereby enabling improvement on a linearity in control of an oscillation frequency of ring oscillator OS15.

Furthermore, bias voltages VC1 and VC2 causes backgate biases of corresponding MOS transistors to be shallower, compared with an operating state of the configuration in which the source and backgate of the MOS transistors are connected to the power supply/ground node, to enable the absolute values of threshold voltages thereof to decrease, thereby enabling improvement on current characteristics thereof under the condition of a low power supply voltage.

First Example Modification

Figure 23:
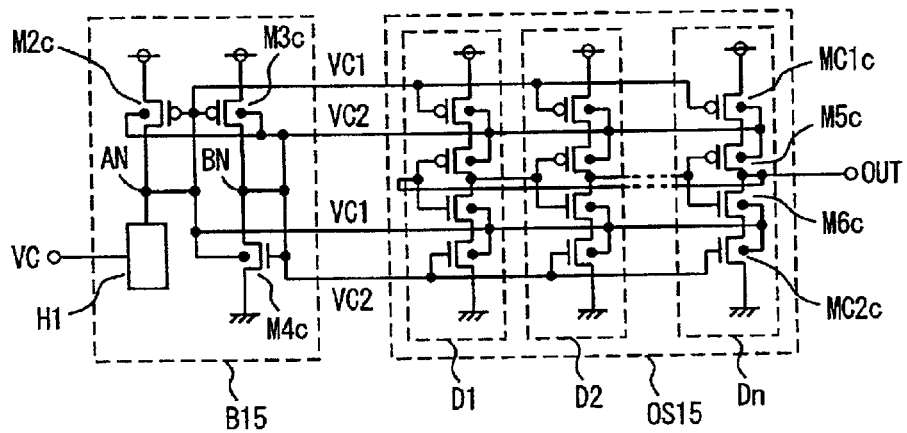
FIG. 23 is a diagram showing a first example of a modification of the fifteenth embodiment of the present invention.

FIG. 23 is a diagram showing a first modification of the fifteenth embodiment of the present invention. In a ring oscillator OS15A of a voltage controlled oscillation circuit shown in FIG. 23, bias voltage VC2 is applied to the backgate of a drive (delay) MOS transistor M5c in each of delay circuits, and bias voltage VC1 is applied to the backgate of a drive (delay) MOS transistor M6c. The other part of the configuration is the same as that of the configuration of the voltage controlled oscillation circuit shown in FIG. 22, the same reference numerals are attached to corresponding components, and detailed description thereof is omitted.

In delay circuits D1 to Dn of a ring oscillator OS15A of the configuration of the voltage controlled oscillation circuit shown in FIG. 23, delay MOS transistors M5c and M6c receive respective bias voltages VC2 and VC1 at the backgates thereof to decrease the absolute values of threshold voltages thereof. Current characteristics of MOS transistors M5c and M6c become the same as those of respective current source transistors MC1c and MC2c to stably operate delay circuits D1 to Dn according to current characteristics determined by bias voltages. Furthermore, a linearity in change is ensured according to a controlled substrate voltage of each transistor of delay circuits D1 to Dn, thereby enabling not only extension of a frequency range but also implementation of a linear responsibility in frequency characteristic with a control voltage.

Second Modification

Figure 24:
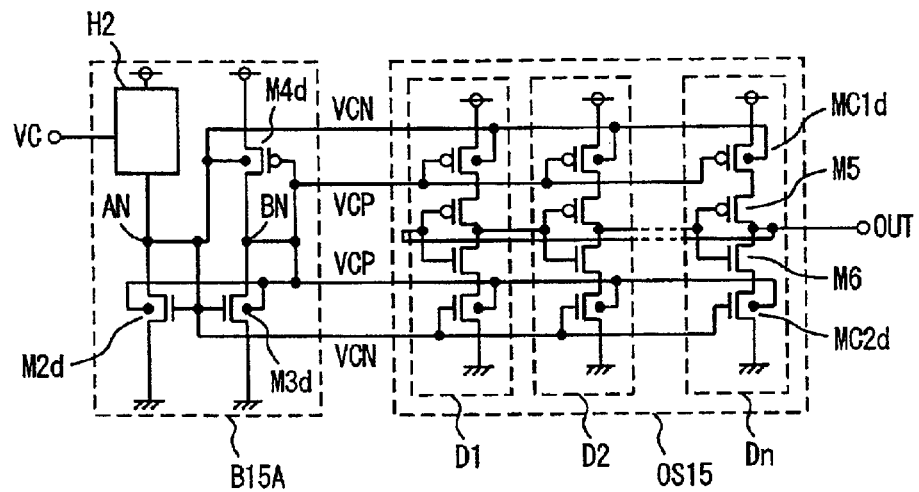
FIG. 24 is a diagram showing a second example of a modification of the fifteenth embodiment of the present invention.

FIG. 24 is a diagram showing a second modification of the fifteenth embodiment of the present invention. In a bias voltage generation circuit B15A shown in FIG. 24, control voltage VC is applied to a voltage/current conversion section H2 connected between a power supply node and node AN. The backgate of a P channel MOS transistor M4d is connected to node AN. A bias voltage VCN is generated at node AN. The gates of N channel MOS transistors M2d and M3d are connected to node AN.

The gate and source of P channel MOS transistor M4d are connected to node BN to generate a bias voltage VCP.

The backgates of MOS transistors M2d and M3d are connected to node BN. Bias voltage VCN from node AN of bias voltage generation circuit B15A is applied to the backgate of current source transistor MC1d in the power supply side of each of delay circuits D1 to Dn of ring oscillator OS15 and further, to the gate of current source transistor MC2d in the ground side of each of delay circuits D1 to Dn. Bias voltage VCP from node BN is applied to the gate of current source transistor MC1d in the power supply side of each of delay circuits D1 to Dn and further, to the backgate of current source transistor MV2d in the ground side of each of delay circuits D1 to Dn.

In the configuration of the voltage controlled oscillation circuit shown in FIG. 24, when a voltage level of control voltage VC rises, a current amount from voltage/current conversion section H2 decreases, bias voltage VCN from node AN lowers, a conductance of N channel MOS transistor MC2d of a current source of ring oscillator OS15 decreases. On the other hand, since a current amount flowing through MOS transistor M4d decreases, a voltage level of bias voltage VCP from node BN rises, and with rise in voltage level of node BN, a decrease arises in a supply current amount of current source MOS transistor MC1d in each of delay circuits D1 to Dn of ring oscillator OS15.

At this time, since a voltage level of bias voltage VCN of the backgate of MOS transistor M4d lowers, the absolute value of a threshold voltage thereof decreases to suppress rapid change in current flowing through MOS transistor M4d and thereby prevent a rapid rise in bias voltage VCP. As bias voltage VCO rises, the backgate biases of MOS transistors M2d and M3d becomes shallow to has the threshold voltages thereof decreased and prevent a rapid decrease in current of node AN, thereby preventing a rapid fall in bias voltage VCN.

In ring oscillator OS15 as well, since the absolute value of a threshold voltage of current source MOS transistor MC1d decrease with lowering of bias voltage VCN, a rapid decrease in conductance of MOS transistor MC1d with bias voltage VCP is suppressed.

Furthermore, a backgate bias of current source N channel MOS transistor M2d in each of delay circuits D1 to Dn becomes shallow by bias voltage VCP received at the backgate thereof to decrease a threshold voltage of MOS transistor M2d, and thereby, it is prevented that a current drive amount of MOS transistor MC2d rapidly changes with lowering of bias voltage VCP.

Therefore, as shown in FIG. 24, in the configuration in which a voltage/current conversion section is provided in the power supply side as well, an oscillation circuit can be implemented that operates stably and has a linear responsibility to a control voltage under a low power supply voltage in a similar manner.

Note that in the configuration shown in FIG. 24, a bias voltage VCN may be applied to the backgate of MOS transistor M5 and further, bias voltage VCP may be applied to the backgate of N channel MOS transistor M6.

Furthermore, note that, in the configurations shown in FIGS. 23 and 24, a similar effect can be attained even if a current source transistor is provided only in one of the power supply node side and the ground node side in each of delay circuits D1 to Dn.

As described above, according to the fifteenth embodiment of the present invention, a bias voltage is applied to the backgate of each current source transistor in a bias voltage generation circuit and a ring oscillator, thereby enabling not only implementation of a linear responsibility of a bias voltage to a control voltage, but also extension of a voltage range.

Sixteenth Embodiment

Figure 25:
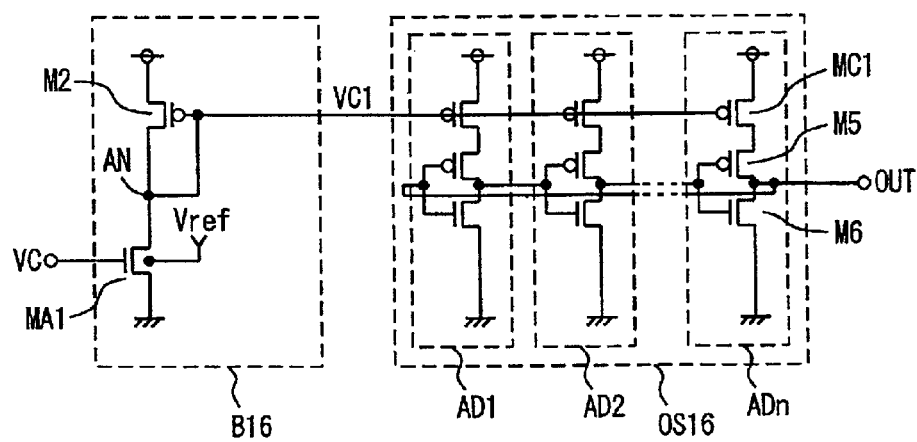
FIG. 25 is a diagram showing a configuration of a voltage controlled oscillation circuit according to a sixteenth embodiment of the present invention.

FIG. 25 is a diagram showing a configuration of a voltage controlled oscillation circuit according to a sixteenth embodiment of the present invention. In FIG. 25, a voltage controlled oscillation circuit includes: a bias voltage generation circuit 16 generating bias voltage VC1 according to control voltage VC; and a ring oscillator OS16 having an oscillation frequency thereof controlled according to bias voltage VC1. Ring oscillator OS16 includes delay circuits AD1 to ADn of an odd number of stages, similar to the configuration of the first to fifteenth embodiments. An output signal of delay circuit at the final stage is fed back to the input of delay circuit at the first stage.

Delay circuits AD1 to ADn each are of the same configuration as others, and in FIG. 25, reference numerals are attached representatively to components of delay circuit ADn at the final stage. In each of delay circuits AD1 to ADn, a current source transistor is provided only in the power supply side supplying a power supply voltage. That is, delay circuits AD1 to ADn each include: a current source MOS transistor MC1 receiving bias voltage VC1 at a gate thereof; a P channel MOS transistor M5 connected between current source transistor MC1 and a corresponding internal output node and receiving, at a gate thereof, an output signal of a delay circuit at the preceding stage; and an N channel MOS transistor M6 connected between the corresponding internal output node and a ground node, and receiving, at a gate thereof, an output signal of the delay circuit at the preceding stage. MOS transistors M5 and M6 constitute a CMOS inverter.

Current source transistors MC1 each have a conductance adjusted according to bias voltage VC1 to adjust a drive current of a corresponding circuit of delay circuits D1 to Dn and change a delay time. In the configuration of delay circuits D1 to Dn, although only a charging current is adjusted in each circuit, a rise time of an output signal of each of the delay circuits is adjusted by adjustment of the charging current of the inverter constituting the delay circuit, so that a delay time of each delay circuit is adjusted in a similar manner. With such an adjustment in rise time, an oscillation frequency of ring oscillator OS16 is adjusted.

Bias voltage generation circuit B16 is merely required to generate bias voltage VC1 with no current mirror circuit provided. Only a master transistor of a current mirror circuit is used to generate bias voltage VC1. That is, bias voltage generation circuit B16 includes: a P channel MOS transistor M2 coupled to a power supply node; and an N channel MOS transistor MA1 connected between internal node AN and a ground node, and receiving control voltage VC at a gate thereof.

MOS transistor M2 functions as a current/voltage conversion element to generate bias voltage VC1 at the gate thereof according to a drive current thereof MOS transistor M2 further constitutes a current mirror circuit with a current source transistor MC1 of each of delay circuits AD1 to ADn.

MOS transistor MA1 receiving control voltage VC at a gate thereof receives reference voltage Vref at a backgate (the substrate region) thereof. Reference voltage Vref is a positive voltage lower than a voltage of a power supply node to which P channel MOS transistor M2 is connected, similar to the first embodiment. A relationship between the substrate bias voltage and threshold voltage of MOS transistor MA1 is the same as that of the configuration of the first embodiment.

MOS transistor MA1 has a conductance thereof changed according to control voltage VC to change a current flowing therethrough. A current flowing through MOS transistor MA1 is supplied from MOS transistor M2. A voltage of node AN, that is, a voltage level of bias voltage VC1 is stabilized at a voltage level at which a drive current of MOS transistor MA1 and a current supplied by MOS transistor M2 is in balance with each other.

An oscillation frequency of ring oscillator OS16 changes according to bias voltage VC1. In each of delay circuits AD1 to ADn, current source transistor MC1 constitutes a current mirror circuit with MOS transistor M2, and a current of the same magnitude as that of a current flowing through MOS transistor M2 flows through current source transistor MC1 (in a case of a mirror ratio=1). Hence, even with a current source transistor provided only in the power supply side in each of delay circuits AD1 to ADn, there can be obtained a wider voltage range in which an oscillation frequency of ring oscillator OS16 can change according to control voltage VC, thereby enabling a voltage range of a phase clocked loop to be extended.

First Modification

Figure 26:
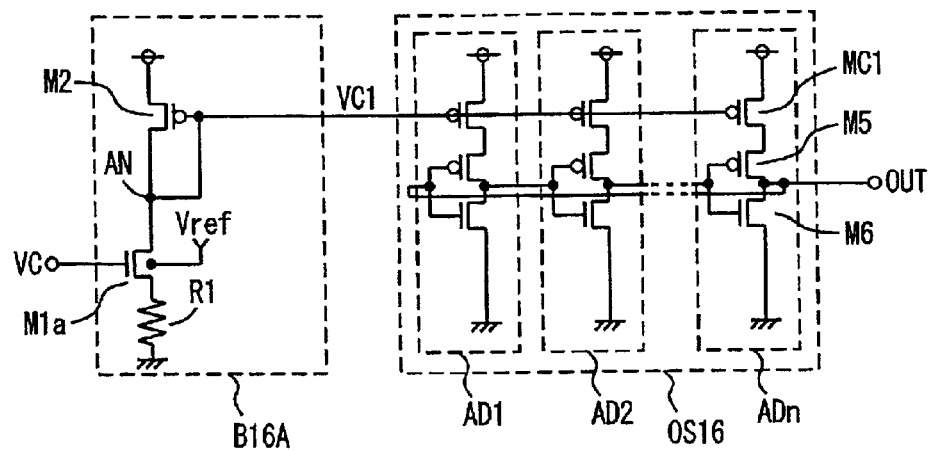
FIG. 26 is a diagram showing a first example of a modification of the sixteenth embodiment of the present invention.

FIG. 26 is a diagram showing the configuration of a voltage controlled oscillation circuit of a first modification of the sixteenth embodiment of the present invention. In a bias voltage generation circuit B16A of the voltage controlled oscillation circuit shown in FIG. 26, a resistance element R1 is connected between an input MOS transistor M1a receiving control voltage VC at a gate thereof and a ground node. The other part of the configuration is the same as that of the configuration shown in FIG. 26, the same reference numerals are attached to corresponding components and detailed description thereof is omitted.

In the configuration shown in FIG. 26, similar to the second embodiment, MOS transistor M1a has a source voltage thereof changed by a resistance element R1b in the direction of suppressing a change in drive current thereof according to a change in voltage level of control voltage VC, to suppress a rapid change in current flowing through MOS transistor M1a.

Therefore, similar to the second embodiment, bias voltage VC1 can be changed almost linearly according to control voltage VC, thereby enabling a linear responsibility of bias voltage VC1 to control voltage VC to be improved.

A resistance value of resistance element R1 has only to be a resistance value to suppress a change according to a square characteristic of a drain current of MOS transistor M1a, similar to the second embodiment and may be determined as any convenient value according to an operating current in bias voltage generation circuit B2.

Furthermore, similar to the second embodiment, reference voltage Vref can be set at a value higher by an increase in source voltage of MOS transistor M1a due to resistance element R1.

As described above, according to the first modification of the sixteenth embodiment of the present invention, a resistance element is connected between an input MOS transistor, receiving a control voltage at the gate thereof and a reference voltage at the backgate thereof, and a ground node, and linearity in response of the bias voltage to the control voltage can be improved, resulting in a correct frequency control.

Second Modification

Figure 27:
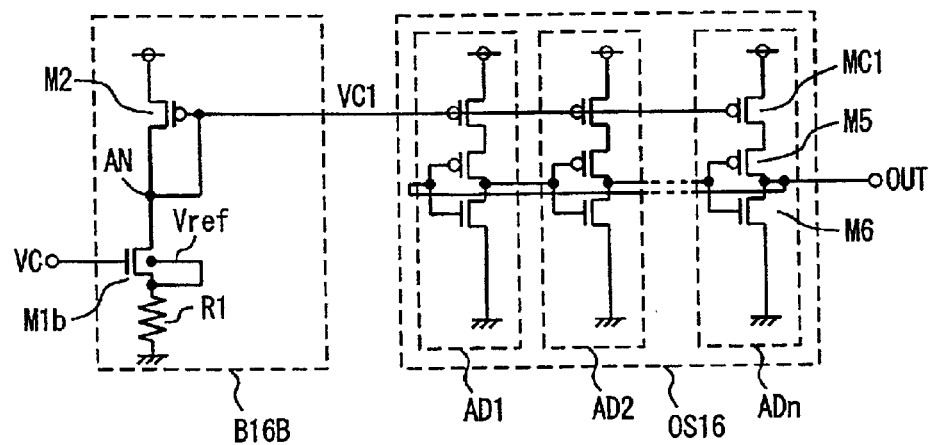
FIG. 27 is a diagram showing a second example of a modification of the sixteenth embodiment of the present invention.

FIG. 27 is a diagram showing the configuration of a voltage controlled oscillation circuit according to a second modification of the sixteenth embodiment of the present invention. In a bias voltage generation circuit B16B of the voltage controlled oscillation circuit shown in FIG. 27, a MOS transistor M1b receiving control voltage VC at a gate thereof has the backgate and source thereof connected together. The other part of the configuration is the same as that of the configuration shown in FIG. 26, the same reference numerals are attached to corresponding components and detailed description thereof is omitted.

In the configuration shown in FIG. 27, similar to the third embodiment, a backgate voltage Vref of a MOS transistor M1b is applied by a voltage drop across a resistance element R1, and therefore, reference voltage Vref changes according to control voltage VC. MOS transistor M1b has the backgate and source thereof connected together, to suppress a backgate bias effect and hold a threshold voltage at a constant value.

Therefore, similar to the third embodiment, it can be suppressed that a current flowing through MOS transistor M1b rapidly changes with a change in control voltage VC, thereby implementing a linear responsibility of bias voltage VC1 to control voltage VC.

Furthermore, therefore, a backgate bias effect (a substrate effect) of MOS transistor M1b can be suppressed, which makes a more correct adjustment in current amount possible, thereby enabling a linear responsibility of bias voltage VC1 to control voltage VC to be implemented.

Third Modification

Figure 28:
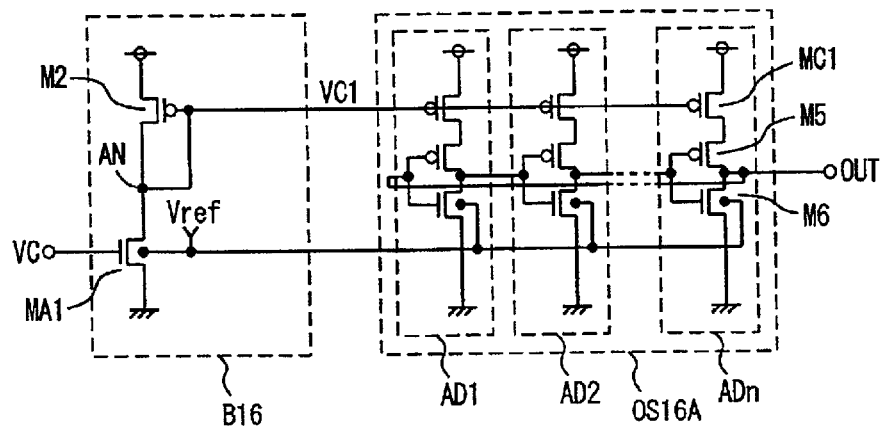
FIG. 28 is a diagram showing a third example of a modification of the sixteenth embodiment of the present invention.

FIG. 28 is a diagram showing the configuration of a voltage controlled oscillation circuit according to a third modification of the sixteenth embodiment of the present invention. In a ring oscillator OS16C of the configuration shown in FIG. 28, reference voltage Vref is applied to the backgate of an N channel MOS transistor M6 in each of delay circuits AD1 to ADn. The other part of the configuration is the same as that of the configuration shown in FIG. 25, the same reference numerals are attached to corresponding components and detailed description is omitted.

In the configuration shown in FIG. 28, in each of delay circuits AD1 to ADn, a reference voltage Vref is applied to the backgate of N channel MOS transistor M6 to decrease a threshold voltage of MOS transistor M6, thereby causing MOS transistor M6 to be in a deep on-state.

Furthermore, control of a threshold voltage is performed only on an N channel MOS transistors, and therefore, the voltage controlled oscillation circuit can be fabricated using a twin-well structure or a single well structure.

In the configuration shown in FIG. 28 as well, there can be provided a similar effect to that of the configuration shown in FIG. 11.

Fourth Modification

Figure 29:
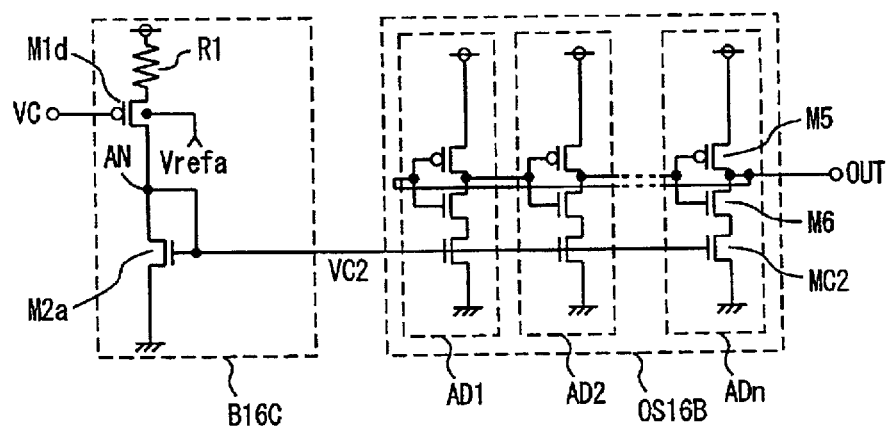
FIG. 29 is a diagram showing a fourth example of a modification of the sixteenth embodiment of the present invention.

FIG. 29 is a diagram showing a configuration of a fourth modification of the sixteenth embodiment of the present invention. In the configuration of shown a bias voltage generation circuit B16C in FIG. 29, an input MOS transistor M1d receiving control voltage VC at a gate thereof is constituted of a P channel MOS transistor. P channel MOS transistor M1d has a source connected to a power supply node through a resistance element R1, a drain connected to node AN and a backgate receiving reference voltage Vrefa. Reference voltage Vrefa is a positive voltage and decreases the a absolute value of a threshold voltage of P channel MOS transistor M1d.

Bias voltage VC2 is generated by an N channel MOS transistor M2a, which has a gate and drain connected to node AN; and a source connected to a ground node. Bias voltage VC2 is generated at node AN and a voltage level thereof is a voltage level at which currents flowing through MOS transistors M1d and M2a are in balance with each other.

In each of delay circuits AD1 to ADn of ring oscillator OS16B, a current source transistor MC2 is provided in the ground side. That is, in each of delay circuits AD1 to ADn, a P channel MOS transistor M5 is connected to a power supply node and an N channel MOS transistor M6 is connected to a ground node through a current source transistor MC2. Current source MC2 is constituted of an N channel MOS transistor and receives bias voltage VC2 at a gate thereof The configuration shown in FIG. 29 is equivalent to a configuration obtained by inverting a conductivity type and a voltage polarity of each MOS transistor in the configuration shown in FIG. 26. An input transistor receiving control voltage VC2 is constituted of a P channel MOS transistor and provided in a power supply node side, and bias voltage VC2 is generated by an N channel MOS transistor provided in a ground node side. A conductance of a current source transistor provided in the ground node side in each of delay circuits AD1 to ADn is controlled by bias voltage VC2. Each of current transistors MG constitutes a current mirror circuit with N channel MOS transistor M2a provided in bias voltage generation circuit OS16A, a mirror current of a current flowing through MOS transistor M2a flows through current source transistor MC2 as well, and bias voltage is generated according to control voltage VC2 to adjust a drive current of each of delay circuits AD1 to ADn, thereby enabling adjustment in oscillation frequency of a ring oscillator.

Note that, in the configuration shown in FIG. 29, a discharging current in each of delay circuits AD1 to ADn is adjusted, and with adjustment in the discharging current, a fall time of an output signal of each of delay circuits AD1 to ADn is adjusted to adjust a delay time of each of delay circuits AD1 to ADn. Hence, in the configuration shown in FIG. 29 as well, there can be provided similar effect to that of the configuration shown in FIG. 26.

Note that in the configuration shown in FIG. 29, resistance element R1 is not required particularly, as in the configuration shown in FIG. 25. Furthermore, similar to the configuration shown in FIG. 27, the backgate of MOS transistor M1d is not necessarily required to be connected to resistance element R1.

Fifth Modification

Figure 30:
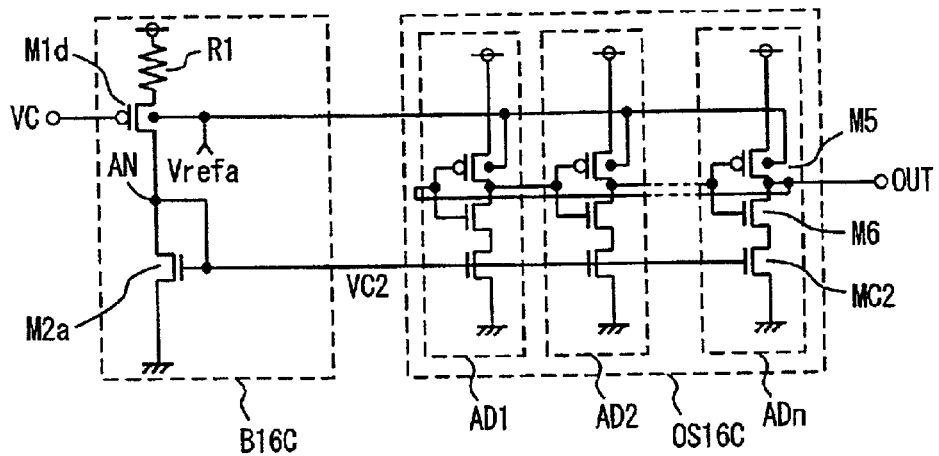
FIG. 30 is a diagram showing a fifth example of a modification of the sixteenth embodiment of the present invention.
Figure 31:
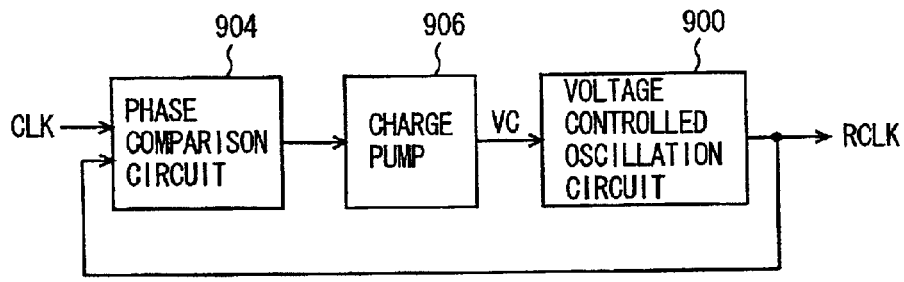
FIG. 31 is a diagram schematically showing a configuration of a conventional phase locked loop.

FIG. 30 is a diagram showing a configuration of a fifth modification of the sixteenth embodiment of the present invention. In the configuration shown in FIG. 30, a reference voltage Vrefa is applied to an input transistor M1d of bias voltage generation circuit B16 and further to the backgate of P channel MOS transistor M5 of each of delay circuits AD1 to ADn as well. The other part of the configuration is the same as that of the configuration shown in FIG. 29, the same reference numerals are attached to corresponding components and detailed description thereof is omitted.

The configuration shown in FIG. 30 is equivalent to a configuration obtained by inverting a conductivity type of each MOS transistor and a polarity of each power supply voltage, and therefore, a similar effect to that of the configuration shown in FIG. 28 can be attained with the configuration shown in FIG. 30.

Note that in the configuration shown in FIG. 30, resistance element R1 is not necessarily required to be provided and the backgate of MOS transistor M2a is not necessarily required to be connected to resistance element R1 either.

Seventeenth Embodiment

In the above description, there is shown a voltage controlled oscillation circuit including a ring oscillator used in a phase locked loop. However, the present invention can be applied to a delayed locked loop, instead of the phase locked loop, in which an input clock signal is delayed to generate an internal clock signal, and the internal clock signal and the input clock signal are locked in phase.

Furthermore, in delay circuits D1 to Dn as well, there may be used differential amplification inverting circuits each inputting or outputting complementary signals, instead of a configuration using CMOS inverters.

As described above, according to the present invention, a backgate bias of a MOS transistor generating a bias voltage is adjusted to decrease the absolute value of a threshold voltage thereof. Therefore, there can be implemented an internal clock generation circuit including a voltage controlled oscillation circuit with a wide voltage range and operating stably even under the condition of a low power supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal clock generation circuit comprising:
   a bias voltage generation circuit including an insulated gate field effect input transistor receiving a control voltage at a gate thereof, for generating a bias voltage according to said control voltage, said insulated gate field effect input transistor receiving a voltage at a voltage level different from a voltage of a power source node at a backgate thereof; and
   a clock generation circuit including a plurality of cascaded delay circuits having respective operating currents determined according to said bias voltage.

2. The internal clock generation circuit according to claim 1, wherein said bias voltage generation circuit further comprises a resistance element coupled between said input transistor and said power source node.

3. The internal clock generation circuit according to claim 2, wherein said backgate of said input transistor is connected to a connection point connecting said input transistor and said resistance element, and said backgate voltage is applied by a voltage at said connection point.

4. The internal clock generation circuit according to claim 1, wherein said bias voltage generation circuit further comprises a current mirror circuit serving as a current source for said input transistor, and
   said backgate of said input transistor is connected to a connection point connecting said current mirror circuit and said input transistor.

5. The internal clock generation circuit according to claim 1, wherein said input transistor receives a reference at a prescribed voltage level at said backgate thereof.

6. An internal clock generation circuit comprising:
   an bias voltage generation circuit for generating a bias voltage according to a control voltage; and
   a clock generation circuit including a plurality of cascaded delay circuits having respective operating currents determined by said bias voltage, each of said delay circuits including a current source insulated gate field effect transistor coupled to a power source node, receiving a voltage at a voltage level different from a voltage of said power source node at a back gate thereof and receiving said bias voltage at a gate thereof.

7. The internal clock generation circuit according to claim 6, wherein said bias voltage generation circuit includes an insulated gate field effect output transistor for generating said bias voltage and a backgate of the output transistor is connected to a backgate of said current source transistor in each of said delay circuits.

8. The internal clock generation circuit according to claim 6, wherein each of said delay circuits includes an insulated gate delay transistor connected in series to said current source transistor, and receiving, at a gate thereof, an output signal of the delay circuit at a preceding stage, the delay transistor having a backgate connected to a backgate of the current source transistor.

9. The internal clock generation circuit according to claim 6, wherein said bias voltage generation circuit comprises an insulated gate field effect input transistor receiving said control voltage at a gate thereof, a backgate of the current source transistor is connected to a first conduction node of the input transistor, and
   a voltage level of said bias voltage is determined according to a voltage level of said first conduction node.

10. The internal clock generation circuit according to claim 9, wherein said bias voltage generation circuit comprises:
    an insulated gate field effect output transistor for outputting said bias voltage; and
    a current mirror circuit coupled to said input transistor and said output transistor, and determining drive currents of said input transistor and said output transistor according to a voltage of said first conduction node of said input transistor.

11. The internal clock generation circuit according to claim 6, wherein said current source transistor in each of said delay circuits receives a reference voltage at a prescribed voltage level at the backgate thereof.

12. An internal clock generation circuit comprising:
    a bias voltage generation circuit for generating a bias voltage according to a control voltage, said bias voltage generation circuit including an input transistor receiving said control voltage at a gate thereof, and a current source circuit coupled between said input transistor and a power source node and having a drive current thereof determined according to a conductance of said input transistor, said current source circuit including a current/voltage conversion element for converting said drive current to a voltage to generate said bias voltage, and said current/voltage conversion element comprising an insulated gate field effect transistor receiving a basis voltage at a voltage level different from a voltage of said power source node at a backgate thereof; and
    a clock generation circuit including a plurality of cascaded delay circuits and having respective operating currents determined by said bias voltage, each of said delay circuits including a current source transistor having a drive current determined by said bias voltage, and said current source transistor comprising an insulated gate field effect transistor having a backgate connected to a backgate of said current/voltage conversion element.

13. The internal clock generation circuit according to claim 12, wherein each of said delay circuits includes a drive transistor connected in series to said current source transistor and receiving, at a gate thereof, an output signal of the delay circuit at a preceding stage, and said drive transistor comprises an insulated gate field effect transistor having a backgate connected to a backgate of said current/voltage conversion element.

14. The internal clock generation circuit according to claim 12, wherein said basis voltage is a reference voltage at a prescribed voltage level.

15. The internal clock generation circuit according to claim 12, wherein said current source circuit comprises:
    a current source master transistor functioning as said current/voltage conversion element, coupled between said input transistor and said power source node, having a drive current thereof changing by a conductance of said input transistor and generating said bias voltage according to said drive current; and a slave transistor constituted of an insulated gate field effect transistor, connected to said current source master transistor, and generating a mirror current of the drive current driven by said current source master transistor, and said bias voltage generation circuit further comprises:
an output transistor coupled to said slave transistor and having a driving current thereof determined by a drive current of said slave transistor to generate a second bias voltage according to said driving current and applying said second bias voltage to a second current transistor in each of said delay circuits, the output transistor having a gate, connected to backgates of said master transistor and said slave transistor, for outputting said second bias voltage.

16. An internal clock generation circuit comprising:
a bias voltage generation circuit for generating a bias voltage according to a control voltage, said bias voltage generation circuit including an input element having a conductance changing according to said control voltage, a current mirror current source circuit having a drive current determined according to said conductance of said input element, and an output transistor having a drive current determined by said drive current of the current source circuit, said current source circuit including an insulated gate field effect master transistor, coupled between said input element and a first power source node, having a drive current determined by the conductance of said input transistor to generate a first bias voltage, and an insulated gate field effect slave transistor having a drive current determined by said drive current of the master transistor, the master transistor and the slave transistor receiving a voltage at a voltage level different from a voltage of said first power source node at their respective backgate, and the output transistor, coupled between said slave transistor and a second power source node, receiving a voltage at a voltage level different from a voltage of said second power source node to generate a second bias voltage according to said drive current of said slave transistor;

a clock generation circuit including a plurality of cascaded delay circuits having respective operating currents determined according to the first and second bias voltage, each of said delay circuits including a first current source transistor, constituted of an insulated gate field effect transistor of a first conductivity type, receiving said first bias voltage at a gate thereof, and having a backgate connected to backgates of the master and slave transistors, and a second current source transistor, constituted of an insulated gate field effect transistor of a second conductivity type, receiving said second bias voltage at a gate thereof, and having a backgate connected to a backgate of the output transistor.

17. The internal clock generation circuit according to claim 16, wherein the master and slave transistors receive a reference voltage at a prescribed voltage level at their respective backgates.

18. The internal clock generation circuit according to claim 16, wherein the output transistor receives a reference voltage at a prescribed level at the backgate thereof.

19. The internal clock generation circuit according to claim 16, wherein the master and slave transistors receive said second bias voltage at the respective backgates thereof and the output transistor receives said first bias voltage at the backgate thereof.

20. The internal clock generation circuit according to claim 16, wherein each of said delay circuits further comprises:
a first insulated gate field effect transistor of a first conductivity type, connected in series to the first current source transistor, receiving, at a gate thereof, an output signal of the delay circuit at a preceding stage, and having a backgate connected to the backgate of said first current source transistor; and a second insulated gate field effect transistor of a second conductivity type, connected between said first insulated gate field effect transistor and said second current source transistor, receiving, at a gate thereof, the output signal of the delay circuit at the preceding stage, and having a backgate is connected to the backgate of said second current source transistor.

21. An internal clock generation circuit comprising:
a bias voltage generation circuit including an insulated gate field effect input transistor receiving a control voltage at a gate thereof, for generating a bias voltage according to said control voltage, said insulated gate field effect input transistor receiving a voltage at a voltage level different from a voltage of a power source node at a back gate thereof, and said control voltage being independent of voltages at a source and a drain of said input transistor; and a clock generation circuit including a plurality of cascaded delay circuits coupled to receive respective operation currents from the power source node and having the respective operation currents determined according to said bias voltage.

22. The internal clock generation circuit according to claim 21, wherein said bias voltage generation circuit further comprises a resistance element coupled between said input transistor and said power source node.

23. The internal clock generation circuit according to claim 22, wherein said back gate of said input transistor is connected to a connection point connecting said input transistor and said resistance element, and said back gate voltage is applied by a voltage at said connection point.

24. The internal clock generation circuit according to claim 21, wherein said bias voltage generation circuit further comprises a current mirror circuit serving as a current source for said input transistor, and
said back gate of said input transistor is connected to a connection point connecting said current mirror circuit and said input transistor.

25. The internal clock generation circuit according to claim 21, wherein said input transistor receives a reference voltage at a prescribed voltage level at said back gate thereof.

* * * * *